(12) United States Patent
Yoon et al.

(10) Patent No.: US 10,896,967 B2
(45) Date of Patent: Jan. 19, 2021

(54) INTEGRATED CIRCUIT DEVICE INCLUDING GATE SPACER STRUCTURE

(71) Applicant: SAMSUNG ELECTRONICS CO., LTD., Suwon-si (KR)

(72) Inventors: Chan-sic Yoon, Anyang-si (KR); Dong-oh Kim, Daegu (KR); Je-min Park, Suwon-si (KR); Ki-seok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/404,996

(22) Filed: May 7, 2019

(65) Prior Publication Data

US 2020/0091305 A1 Mar. 19, 2020

(30) Foreign Application Priority Data

Sep. 13, 2018 (KR) .................. 10-2018-0109727

(51) Int. Cl.
*H01L 29/423* (2006.01)
*H01L 29/66* (2006.01)
*H01L 29/51* (2006.01)

(52) U.S. Cl.
CPC ...... *H01L 29/42364* (2013.01); *H01L 29/513* (2013.01); *H01L 29/6656* (2013.01)

(58) Field of Classification Search
CPC ......... H01L 27/10897; H01L 29/42364; H01L 29/512; H01L 29/513; H01L 29/517; H01L 29/6653; H01L 29/6656; H01L 29/66575; H01L 29/66651
See application file for complete search history.

(56) References Cited

U.S. PATENT DOCUMENTS

| 8,063,449 B2 | 11/2011 | Han et al. | |
| 2002/0100943 A1 | 8/2002 | Ogata et al. | |
| 2005/0151224 A1* | 7/2005 | Abe | H01L 21/32135 257/510 |
| 2005/0167741 A1* | 8/2005 | Divakaruni | H01L 29/42376 257/328 |
| 2006/0094176 A1* | 5/2006 | Fehlhaber | H01L 21/28141 438/197 |
| 2007/0145496 A1 | 6/2007 | Shin | |

(Continued)

FOREIGN PATENT DOCUMENTS

| JP | 2006-080261 A | 3/2006 |
| JP | 2009-164200 A | 7/2009 |

(Continued)

*Primary Examiner* — Allan R Wilson
(74) *Attorney, Agent, or Firm* — Lee IP Law, P.C.

(57) ABSTRACT

An integrated circuit device includes a gate stack structure on a base layer, the gate stack structure having a gate insulating layer with a first dielectric layer on the base layer and having first relative permittivity, and a gate structure on the gate insulating layer, and a gate spacer structure on opposite side walls of the gate stack structure and on the base layer, the gate spacer structure including a buried dielectric layer buried in a recess hole of the gate insulating layer at a lower portion of the gate spacer structure on the base layer, and the buried dielectric layer including a same material as the first dielectric layer.

20 Claims, 36 Drawing Sheets

(56) References Cited

U.S. PATENT DOCUMENTS

| | | | |
|---|---|---|---|
| 2008/0305597 A1* | 12/2008 | Kitano | H01L 29/517 |
| | | | 438/287 |
| 2009/0057784 A1 | 3/2009 | Chen | |
| 2013/0020655 A1* | 1/2013 | Mieno | H01L 29/66545 |
| | | | 257/408 |
| 2013/0037866 A1 | 2/2013 | Thees et al. | |
| 2014/0327056 A1 | 11/2014 | Park et al. | |
| 2014/0374840 A1* | 12/2014 | Lee | H01L 21/823821 |
| | | | 257/401 |

FOREIGN PATENT DOCUMENTS

| KR | 10-2010-0078511 A | 7/2010 |
|---|---|---|
| KR | 10-1038310 B1 | 5/2011 |

* cited by examiner

INTEGRATED CIRCUIT DEVICE INCLUDING GATE SPACER STRUCTURE

CROSS-REFERENCE TO RELATED APPLICATION

Korean Patent Application No. 10-2018-0109727, filed on Sep. 13, 2018, in the Korean Intellectual Property Office, and entitled: "Integrated Circuit Device Including Gate Spacer Structure," is incorporated by reference herein in its entirety.

BACKGROUND

1. Field

Embodiments relate to an integrated circuit device, and more particularly, to an integrated circuit device including a gate spacer structure.

2. Description of the Related Art

In an integrated circuit device, gate spacer structures may be formed on both side walls of a gate stack structure. As the integrated circuit device is highly integrated, the reliability of a gate insulating layer of the integrated circuit device may decrease due to components of the gate spacer structures. In addition, the integrated circuit device may have increased parasitic capacitance due to the components of the gate spacer structures.

SUMMARY

According to an aspect, there is provided an integrated circuit device including a gate stack structure including a gate insulating layer and a gate structure on the gate insulating layer, the gate insulating layer including a first dielectric layer on a base layer and having first relative permittivity, and a gate spacer structure on both side walls of the gate stack structure on the base layer. The gate spacer structure includes a buried dielectric layer buried in a recess hole in the gate insulating layer at a lower portion of the gate spacer structure on the base layer, the buried dielectric layer including the same material as the first dielectric layer.

According to another aspect, there is provided an integrated circuit device including a gate stack structure including a gate insulating layer and a gate structure on the gate insulating layer, the gate insulating layer including a first dielectric layer on a base layer and having first relative permittivity and a second dielectric layer having second relative permittivity greater than the first relative permittivity, and the gate structure including a metal layer, and a gate spacer structure on both side walls of the gate stack structure and on the base layer. The gate spacer structure includes: a first spacer on both side walls of the gate structure, including a third dielectric layer having third relative permittivity greater than the first relative permittivity, and having an I shape, a second spacer including a buried dielectric layer buried in a recess hole in the first dielectric layer, the second spacer including the same material as the first dielectric layer at a lower portion of the first spacer, on a side wall of the first spacer and a side wall of the buried dielectric layer, integrally disposed with the buried dielectric layer, and including the same material as the buried dielectric layer, a third spacer on a side wall of the second spacer, including the same material as the first spacer, and having an L shape, and a fourth spacer on a side wall and an upper portion of the third spacer and including the same material as the second spacer.

According to another aspect, there is provided an integrated circuit device including a gate stack structure including a gate insulating layer and a gate structure disposed on the gate insulating layer, the gate insulating layer including a first dielectric layer on a base layer and having first relative permittivity and a second dielectric layer having second relative permittivity greater than the first relative permittivity, and the gate structure including a metal layer, and a gate spacer structure on both side walls of the gate stack structure on the base layer. The gate spacer structure includes a first spacer on both side walls of the gate structure, including a third dielectric layer having third relative permittivity greater than the first relative permittivity, and having an I shape, a buried dielectric layer buried in a recess hole in the first dielectric layer and having the same material as the first dielectric layer at a lower portion of the first spacer, a second spacer on a side wall of the first spacer and a side wall of the buried dielectric layer and the base layer and including the same material as the first spacer, and a third spacer on a side wall and an upper portion of the second spacer and including the same material as the buried dielectric layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
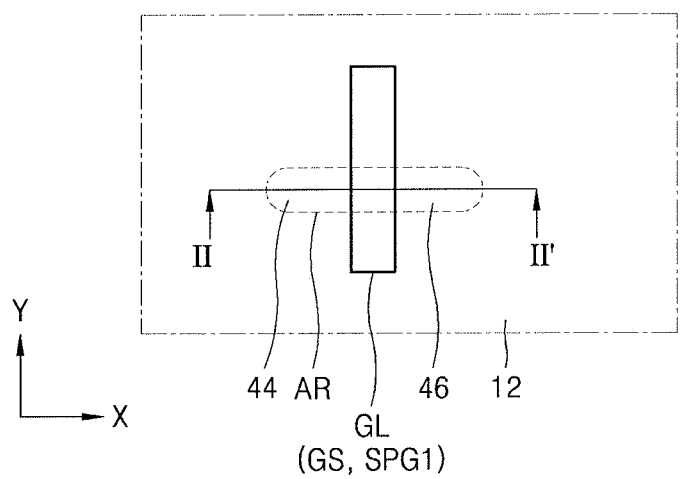
FIG. 1 illustrates a plan view of an integrated circuit device according to an embodiment.

FIG. 1 is a plan view of an integrated circuit device 1 according to an embodiment.

In particular, as shown in FIG. 1, the integrated circuit device 1 may have an active region AR on a semiconductor substrate 12 in an X direction (a first direction). The integrated circuit device 1 may have a gate line GL crossing the active region AR in a Y direction (a second direction). The gate line GL may include a gate stack structure GS and gate spacer structures SPG1. The X direction may be perpendicular to the Y direction. The gate line GL may be a word line.

FIG. 1 shows that the active region AR lies in a direction parallel to the X direction, but according to necessity the active region AR may be aligned at a certain degree from the X direction, e.g., diagonally aligned at 45 degrees. In the active region AR on both sides of the gate line GL, a source area 44 and a drain area 46 may be disposed.

The integrated circuit device 1 may include the gate line GL, the source area 44, and the drain area 46 and thus may include a transistor. FIG. 1 shows only one transistor, but the integrated circuit device 1 may include multiple transistors. The integrated circuit device 1 may be a memory device including a cell array area and a peripheral circuit area. In an embodiment, the integrated circuit device 1 of FIG. 1 may be formed in the peripheral circuit area.

Figure 2:
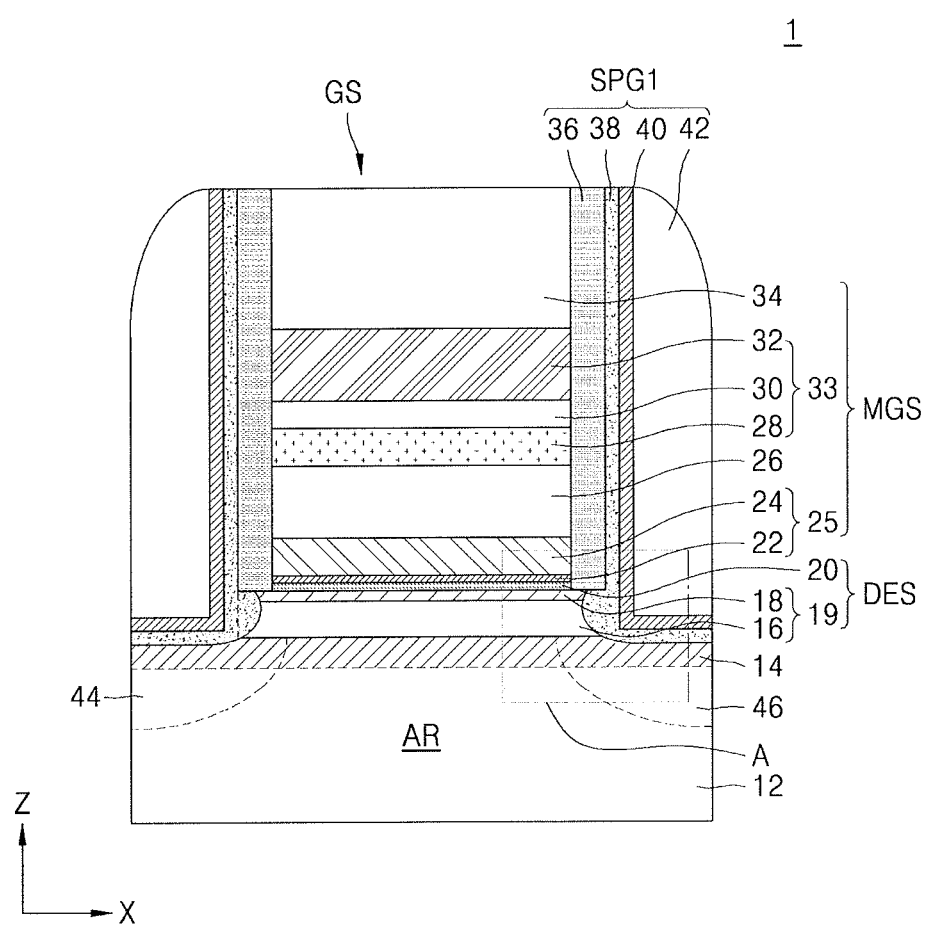
FIG. 2 illustrates a cross-sectional view taken along line II-II' of FIG. 1.
Figure 3:
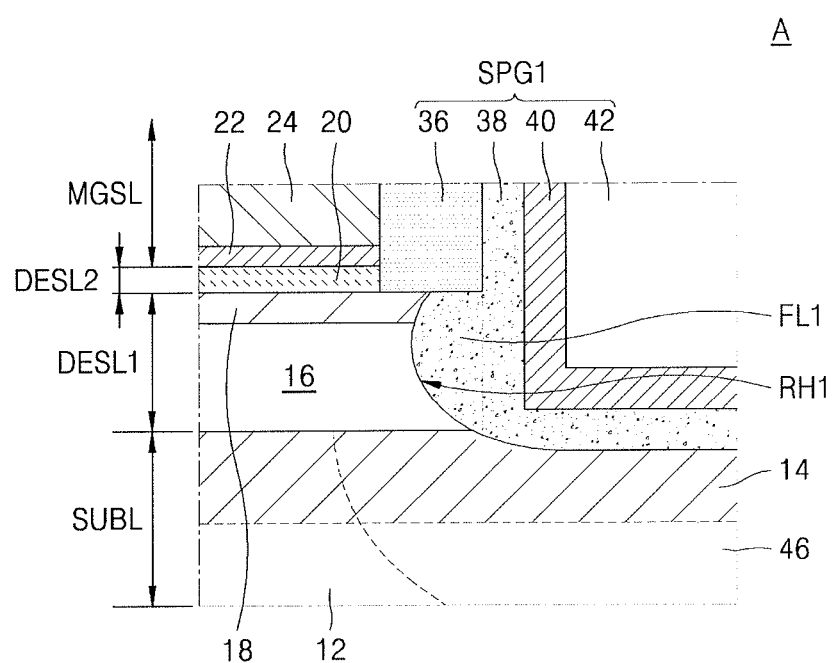
FIG. 3 illustrates an enlarged view of FIG. 2.

FIG. 2 is a cross-sectional view taken along line II-II' of FIG. 1. FIG. 3 is an enlarged portion A of FIG. 2.

In particular, FIG. 2 shows that components are stacked in a Z direction (a third direction) that is perpendicular to a plane in the X direction and the Y direction. Referring to FIG. 2, while only one gate stack structure GS is illustrated, multiple gate stack structures GS may be formed apart from each other on base layers 12 and 14. FIG. 3 is an enlarged view showing in detail lower portions of the gate stack structure GS and the gate spacer structure SPG1 on the base layers 12 and 14.

The integrated circuit device 1 may include the source area 44 and the drain area 46 on both, e.g., opposite, sides of the gate stack structure GS and the lower portion of the gate spacer structure SPG1. The source area 44 and the drain area 46 may be formed on the base layers 12 and 14 (i.e., the semiconductor substrate 12 and a semiconductor layer 14, respectively). The semiconductor substrate 12 may include the active region AR. The integrated circuit device 1 may include the gate stack structure GS including a gate insulating layer DES and a gate structure MGS. The gate insulating layer DES may be formed on the base layers 12 and 14 including the semiconductor substrate 12 and the semiconductor layer 14.

The semiconductor substrate 12 may include silicon (Si), e.g., crystalline Si, polycrystalline Si, or amorphous Si. In an embodiment, the semiconductor substrate 12 may include a chemical semiconductor, e.g., germanium (Ge) or SiGe, silicon carbide (SiC), gallium arsenide (GaAs), indium arsenide (InAs), or indium phosphide (InP). In an embodiment, the semiconductor substrate 12 may include a conductive area, e.g., a well doped with impurities or a structure doped with impurities. In an embodiment, the semiconductor substrate 12 may be a silicon substrate.

The semiconductor layer 14 may be a material layer capable of improving the carrier mobility. The semiconductor layer 14 may be, e.g., a SiGe layer. According to necessity, the semiconductor layer 14 may be selectively formed. As shown in FIG. 3, the base layers 12 and 14 including the semiconductor substrate 12 and the semiconductor layer 14 may be referred to as substrate levels SUBL in the Z direction.

The gate insulating layer DES may be referred to as a gate dielectric layer. The gate insulating layer DES may include a first dielectric layer 19 having first relative permittivity (first relative dielectric constant or first dielectric constant) and a second dielectric layer 20 having second relative permittivity (second relative dielectric constant or second dielectric constant) that is greater than the first relative permittivity. The first dielectric layer 19 may include a sub-dielectric layer 16 and an interface layer 18. A thickness of the sub-dielectric layer 16 may be greater than that of the interface layer 18, e.g., in the Z direction.

The sub-dielectric layer 16 and the interface layer 18 may be silicon oxide layers. When the sub-dielectric layer 16 and the interface layer 18 are silicon oxide layers, the first relative permittivity may be about 3.9. The interface layer 18 is to improve interface properties between the sub-dielectric layer 16 and the second dielectric layer 20, e.g., the interface layer 18 may be formed between the sub-dielectric layer 16 and the second dielectric layer 20, or the interface layer 18 may be omitted according to necessity.

The second dielectric layer 20 may be formed on the first dielectric layer 19. A thickness of the second dielectric layer 20 may be less than that of the first dielectric layer 19, e.g., along the Z direction. The second dielectric layer 20 may include a high-k dielectric layer having the second relative permittivity that is greater than that of a silicon oxide layer having the first relative permittivity. The second dielectric layer 20 may have the second relative permittivity (the second relative dielectric constant or the second dielectric constant) ranging from about 10 to about 25.

In an embodiment, the second dielectric layer 20 may include at least one material of, e.g., hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

As shown in FIG. 3, a first dielectric layer level DESL1 and a second dielectric layer level DESL2 may be disposed on the substrate level SUBL in the Z direction. The first dielectric layer level DESL1 may include the sub-dielectric layer 16 and the interface layer 18. The second dielectric layer level DESL2 may include the second dielectric layer 20. A gate structure level MGSL including the gate structure MGS may be on the second dielectric layer level DESL2 in the Z direction.

The gate structure MGS may be a metal gate structure including a metal layer. The gate structure MGS may include a work function control layer 25, a first gate layer 26, a second gate layer 33, and a capping layer 34. The work function control layer 25 may be a metal-containing work function control layer. The work function control layer 25 may include, e.g., metal, conductive metal nitride, conductive metal carbide, a conductor including metal atoms, or a combination thereof. The work function control layer 25 may have a single layer structure or a multilayer structure.

In an embodiment, the work function control layer 25 may include a first work function control layer 22 and a second work function control layer 24. The first work function control layer 22 may be a single metal layer. The first work function control layer 22 may include, e.g., at least one of titanium (Ti), tantalum (Ta), aluminum (Al), nickel (Ni), cobalt (Co), lanthanum (La), niobium (Nb), molybdenum (Mo), hafnium (Hf), iridium (Ir), ruthenium (Ru), platinum (Pt), ytterbium (Yb), dysprosium (Dy), erbium (Er) or palladium (Pd). The second work function control layer 24 may be conductive metal nitride or conductive metal carbide. The second work function control layer 24 may include at least one of, e.g., HfSiMo, TiN, WN, TaN, RuN, MoN, TaC, TiC, and TaC.

In an embodiment, the work function control layer 25 may have a single layer structure or a multilayer structure. In an embodiment, the work function control layer 25 may have at least one stack structure of, e.g., TiN/TaN, Al$_2$O$_3$/TiN, Al/TiN, TiN/Al/TiN, TiN/TiON, Ta/TiN, TaN/TiN, La/TiN, Mg/TiN, and Sr/TiN. Here, TiN may be replaced with TaN, TaCN, TiCN, CoN, or CoCN, and La may be replaced with LaO or LaON.

The first gate layer 26 may include doped polysilicon or metal, e.g., W, Mo, Au, Cu, Al, Ni, or Co. The first gate layer 26 may be a single layer including, e.g., a material from among the above-listed materials, or layers including at least two thereof.

The second gate layer 33 may include barrier metal layers 28 and 30 and a metal layer 32. The barrier metal layers 28 and 30 may be layers in which metal and metal nitride are combined. The barrier metal layers 28 and 30 may have at least one stack structure of, e.g., Ta/TiN, Ti/TiN, Mg/TiN, and Sr/TiN. The metal layer 32 may include, e.g., W, Mo, Au, Cu, Al, Ni, or Co. The capping layer 34 may be, e.g., a silicon nitride layer.

The integrated circuit device 1 may include the gate spacer structures SPG1 formed on both sides of the gate stack structure GS on the base layers 12 and 14. As described below, the gate spacer structure SPG1 may include multiple components. The gate spacer structure SPG1 may improve the reliability of the gate insulating layer DES and reduce the parasitic capacitance by optimizing the components.

In more detail, the gate spacer structure SPG1 may include the gate insulating layer DES, i.e., a buried dielectric layer FL1 which is buried in a recess hole RH1 in the first dielectric layer 19 and includes the same material as the first dielectric layer 19.

The buried dielectric layer FL1 may improve the reliability of the first dielectric layer 19 by preventing damage to lower edge portions of the first dielectric layer 19 when impurities are injected to form the source area 44 and the drain area 46. In other words, the buried dielectric layer FL1 may protect the first dielectric layer 19 and keep electrical characteristics, i.e., time dependent dielectric breakdown (TDDB) characteristics, of the gate insulating layer DES appropriate.

In addition, the buried dielectric layer FL1 includes the same material as the first dielectric layer 19, e.g., silicon oxide, and thus the electrical characteristics of the gate insulating layer DES, i.e., the TDDB characteristics, may be improved compared to a case where the buried dielectric layer FL1 includes other materials, e.g., silicon nitride.

The gate spacer structures SPG1 may each include a first spacer 36, a second spacer 38, a third spacer 40, and a fourth spacer 42. The first spacer 36 may be formed to have a linear bar shape, e.g., I-shape, on both side walls of the gate structure MGS. The first spacer 36 may include a third dielectric layer having third relative permittivity (third relative dielectric constant or third dielectric constant) that is greater than the first relative permittivity of the silicon oxide layer. The first spacer 36 may be, e.g., a silicon nitride layer. The relative permittivity of the silicon nitride layer may be about 6.9.

The second spacer 38 may be formed on side walls of the first spacer 36 and the buried dielectric layer FL1, and on the base layers 12 and 14. That is, the second spacer 38 is formed in an L shape on the base layer 14, e.g., with two perpendicularly connected portions, so a vertical portion of the L shape extends along the side walls of the first spacer 36 and the buried dielectric layer FL1, and a horizontal portion of the L shape extends away from the vertical portion along the top of the base layer 14. The second spacer 38 may be integrally formed with the buried dielectric layer FL1 and include the same material as the buried dielectric layer FL1. The second spacer 38 may be, e.g., a silicon oxide layer.

The third spacer 40 may be formed in an L shape on one side wall and an upper portion of the second spacer 38. The third spacer 40 may include the same material as the first spacer 36. The third spacer 40 may be, e.g. a silicon nitride layer. The fourth spacer 42 may be formed on a wall and an upper portion of the third spacer 40. The fourth spacer 42 may include the same material as the second spacer 38. The fourth spacer 42 may be, e.g., a silicon oxide layer. A horizontal width (a width in the X direction) of the fourth spacer 42 may be greater than horizontal widths of, e.g., vertical portions of, the first spacer 36 and the third spacer 40.

When the third spacer 40 and the fourth spacer 42 are a silicon nitride layer and a silicon oxide layer, respectively, the third spacer 40 may prevent oxygen atoms included in the fourth spacer 42 from entering the first dielectric layer 19 during the manufacture of the integrated circuit device 1. Accordingly, the integrated circuit device 1 may prevent an increase in a threshold voltage during its operation.

In the gate spacer structure SPG1, the horizontal width of the fourth spacer 42 including the silicon oxide layer having low relative permittivity is greater than the horizontal widths of the first spacer 36 and the third spacer 40 which have high relative permittivity. Moreover, the gate spacer structure SPG1 includes the second spacer 38 including the silicon oxide layer having low relative permittivity. Accordingly, the gate spacer structure SPG1 of the integrated circuit device 1 may reduce the parasitic capacitance with other adjacent conductive layers, e.g., adjacent gate stack structures.

Figure 4:
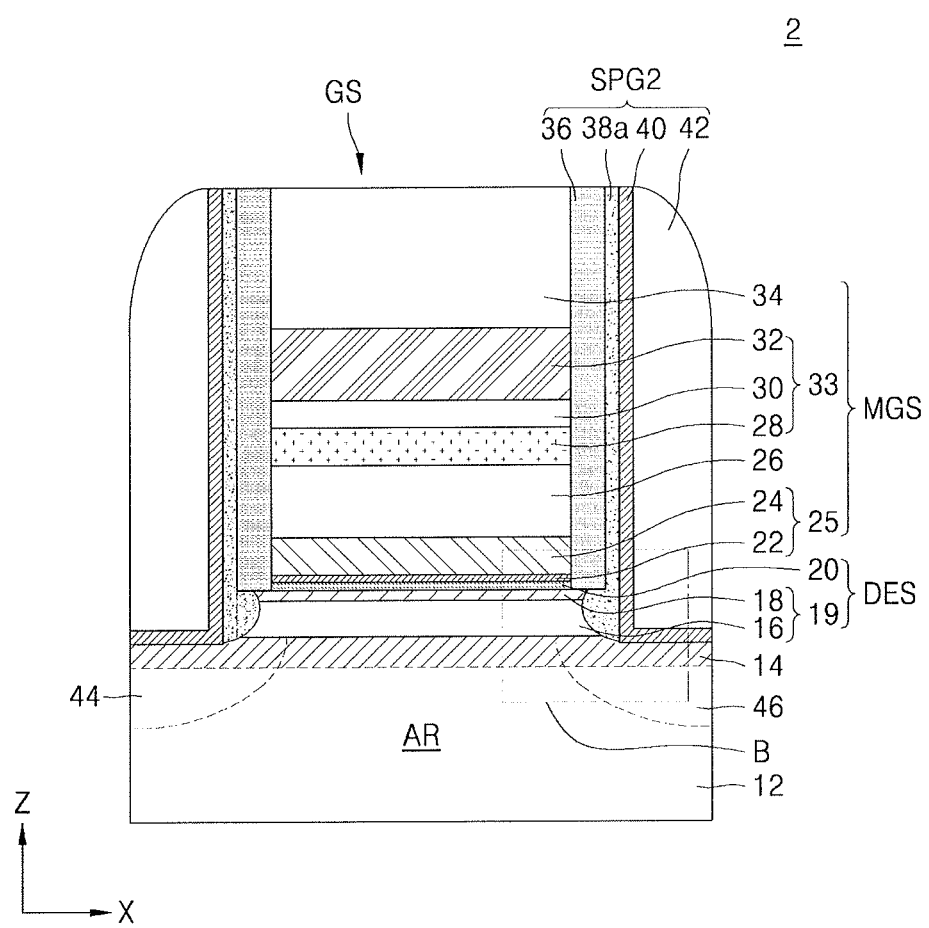
FIG. 4 illustrates a cross-sectional view of an integrated circuit device according to an embodiment.
Figure 5:
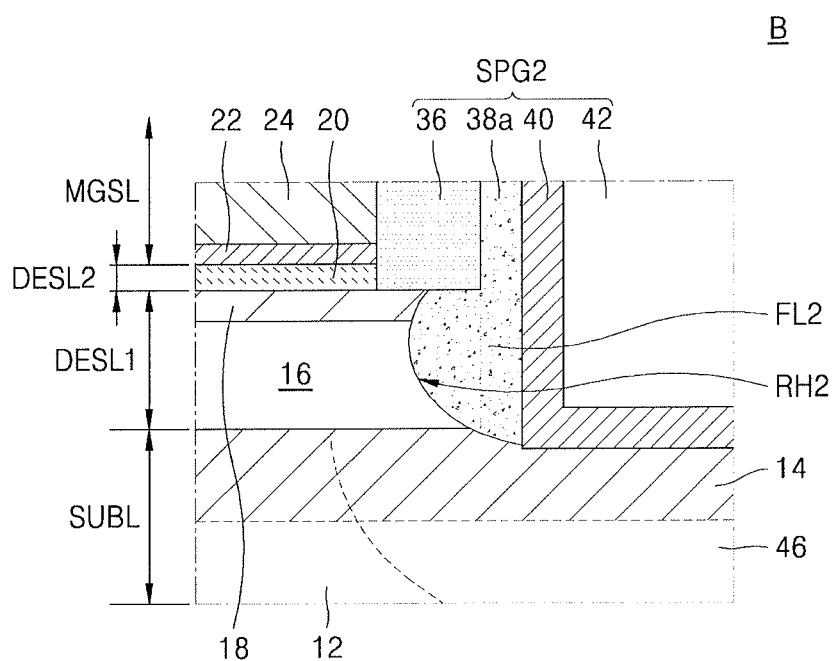
FIG. 5 illustrates an enlarged view of FIG. 4.

FIG. 4 is a cross-sectional view of an integrated circuit device 2 according to an embodiment. FIG. 5 is an enlarged view of portion B of FIG. 4.

In particular, the integrated circuit device 2 may be identical to the integrated circuit device 1 of FIGS. 1 to 3, except for a structure of a gate spacer structures SPG2. The descriptions that are already provided with reference to FIGS. 1 to 3 will be only briefly provided or omitted herein. FIG. 5 is an enlarged view for explaining in more detail lower portions of the gate stack structure GS and the gate spacer structures SPG2 on the base layers 12 and 14.

The integrated circuit device 2 may include the gate stack structure GS including the gate insulating layer DES and the gate structure MGS, and the gate spacer structures SPG2. The gate spacer structure SPG2 may improve the reliability of the gate insulating layer DES and may reduce the parasitic capacitance by optimizing components.

The gate spacer structure SPG2 may include the gate insulating layer DES, i.e., a buried dielectric layer FL2 which is buried in a recess hole RH2 in the first dielectric layer 19 and includes the same material as the first dielectric layer 19. As described above with reference to FIGS. 2 and 3, the buried dielectric layer FL2 may prevent damage to lower edge portions of the first dielectric layer 19 when impurities are injected to form the source area 44 and the drain area 46, and may keep the electrical characteristics, i.e., the TDDB characteristics, of the gate insulating layer DES appropriate. In addition, the buried dielectric layer FL2 includes the same material as the first dielectric layer 19, e.g., silicon oxide, and thus the electrical characteristics, i.e., the TDDB characteristics, of the gate insulating layer DES, may be improved compared to a case where the buried dielectric layer FL2 includes other materials, e.g., silicon nitride.

The gate spacer structures SPG2 may each include the first spacer 36, a second spacer 38a, the third spacer 40, and the fourth spacer 42. The first spacers 36 may be formed in I shapes on the side walls of the gate structure MGS. The first spacer 36 may include the third dielectric layer having the third relative permittivity (the third relative dielectric constant or the third dielectric constant) that is greater than the first relative permittivity of the silicon oxide layer. The first spacer 36 may include the silicon nitride layer. The relative permittivity of the silicon nitride layer may be about 6.9.

The second spacer 38a may be formed to have a linear bar shape, e.g., in an I shape, on side walls of the first spacer 36 and the buried dielectric layer FL2. The second spacer 38a may be integrally formed with the buried dielectric layer FL2 and may include the same material as the buried dielectric layer FL2. The second spacer 38a may include the silicon oxide layer.

The third spacer 40 may be formed in an L shape on a wall and an upper portion of the second spacer 38a. The third spacer 40 may include the same material as the first spacer 36. The third spacer 40 may include the silicon nitride layer. The fourth spacer 42 may be formed on the wall and the upper portion of the third spacer 40. The fourth spacer 42 may include the same material as the second spacer 38a. The fourth spacer 42 may include the silicon oxide layer.

The third spacer 40 and the fourth spacer 42 include the silicon nitride layer and the silicon oxide layer, respectively, and the third spacer 40 contacts the semiconductor layer 14. Accordingly, the third spacer 40 may well prevent oxygen atoms included in the fourth spacer 42 from entering the first dielectric layer 19 during the manufacture of the integrated circuit device 2. Therefore, the integrated circuit device 2 may prevent an increase in a threshold voltage during the operation.

In addition, in the gate spacer structure SPG2, a horizontal width of the fourth spacer 42 including the silicon oxide layer having low relative permittivity is greater than horizontal widths of the first spacer 36 and the third spacer 40 which have high relative permittivity. In addition, the gate spacer structure SPG2 includes the second spacer 38a including the silicon oxide layer having low relative permittivity. Accordingly, the gate spacer structure SPG2 of the integrated circuit device 2 may reduce the parasitic capacitance with other adjacent conductive layers, e.g., adjacent gate stack structures.

Figure 6:
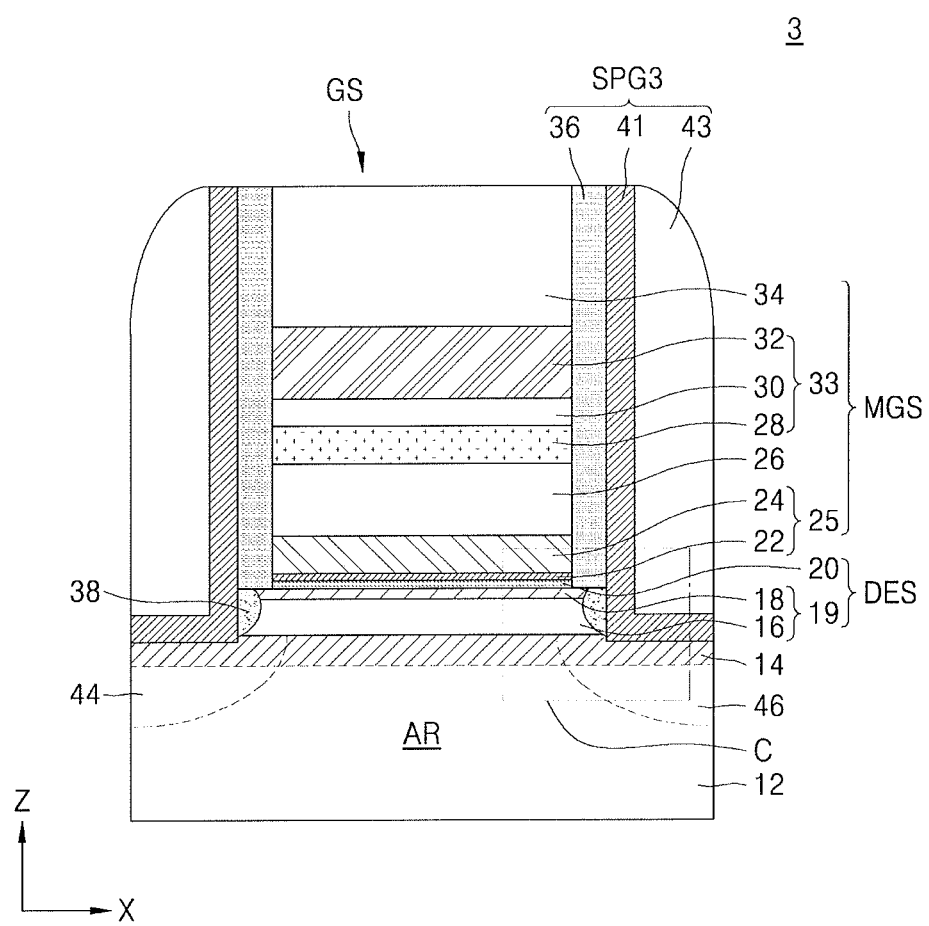
FIG. 6 illustrates a cross-sectional view of an integrated circuit device according to an embodiment.
Figure 7:
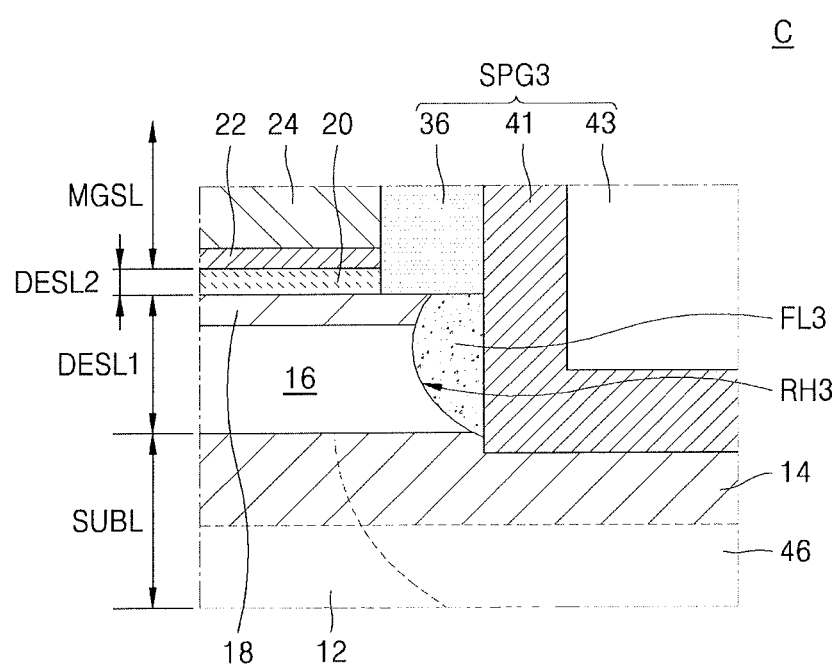
FIG. 7 illustrates an enlarged view of FIG. 6.

FIG. 6 is a cross-sectional view of an integrated circuit device 3 according to an embodiment. FIG. 7 is an enlarged view of portion C of FIG. 6.

In particular, the integrated circuit device 3 may be identical to the integrated circuit device 1 of FIGS. 1 to 3 and the integrated circuit device 2 of FIGS. 4 and 5, except for a structure of gate spacer structures SPG3. The descriptions that are already provided with reference to FIGS. 1 to 5 will be only briefly provided or omitted herein. FIG. 7 is an enlarged view for explaining in more detail lower portions of the gate stack structure GS and the gate spacer structure SPG3 on the base layer 12 and 14.

The integrated circuit device 3 may include the gate stack structure GS including the gate insulating layer DES and the gate structure MGS, and the gate spacer structures SPG3. The gate spacer structure SPG3 may improve the reliability of the gate insulating layer DES and may reduce the parasitic capacitance by optimizing components.

The gate spacer structure SPG3 may include the gate insulating layer DES, i.e., a buried dielectric layer FL3 which is buried in a recess hole RH3 in the first dielectric layer 19 and includes the same material as the first dielectric layer 19. As described above with reference to FIGS. 2 to 5, the buried dielectric layer FL3 may protect the first dielectric layer 19 and may keep the electrical characteristics, i.e., the TDDB characteristics, of the gate insulating layer DES appropriate.

The gate spacer structures SPG3 may each include the first spacer 36, a second spacer 41, and a third spacer 43. The first spacers 36 may be formed in I shapes on both side walls of the gate structure MGS. The first spacer 36 may include the third dielectric layer having the third relative permittivity (the third relative dielectric constant or the third dielectric constant) that is greater than the first relative permittivity of the silicon oxide layer. The first spacer 36 may include the silicon nitride layer. The relative permittivity of the silicon nitride layer may be about 6.9.

The second spacer 41 may be formed in an L shape on a wall of the first spacer 36, a wall of the buried dielectric layer FL3, and the base layers 12 and 14, i.e., the semiconductor layer 14. The second spacer 41 may include the same material as the first spacer 36. The second spacer 41 may include, e.g., a silicon nitride layer.

The third spacer 43 may be formed on a wall and an upper portion of the second spacer 41. The third spacer 43 may include the same material as the buried dielectric layer FL3. The third spacer 43 may include the silicon oxide layer. A horizontal width of the third spacer 43 (a width in the X direction) may be greater than horizontal widths of the first spacer 36 and the second spacer 41.

When the second spacer 41 and the third spacer 43 include the silicon nitride layer and the silicon oxide layer, respectively, the second spacer 41 may prevent oxygen atoms included in the third spacer 43 from entering the first dielectric layer 19 during the manufacture of the integrated circuit device 3. Accordingly, the integrated circuit device 3 may prevent an increase in a threshold voltage during the operation.

In the gate spacer structure SPG3, the horizontal width of the third spacer 43 including the silicon oxide layer having low relative permittivity is greater than the horizontal widths of the first spacer 36 and the second spacer 41 which have high relative permittivity. Accordingly, the gate spacer structure SPG3 of the integrated circuit device 3 may reduce the parasitic capacitance with other adjacent conductive layers, e.g., adjacent gate stack structures.

FIGS. 8A to 8D are cross-sectional views for explaining a method of manufacturing an integrated circuit device, according to an embodiment. In particular, FIGS. 8A to 8D are provided to explain a method of manufacturing the integrated circuit device 1 of FIGS. 2 and 3. The descriptions that are already provided with reference to FIGS. 2 and 3 will be only briefly provided or omitted herein.

Figure 8A:
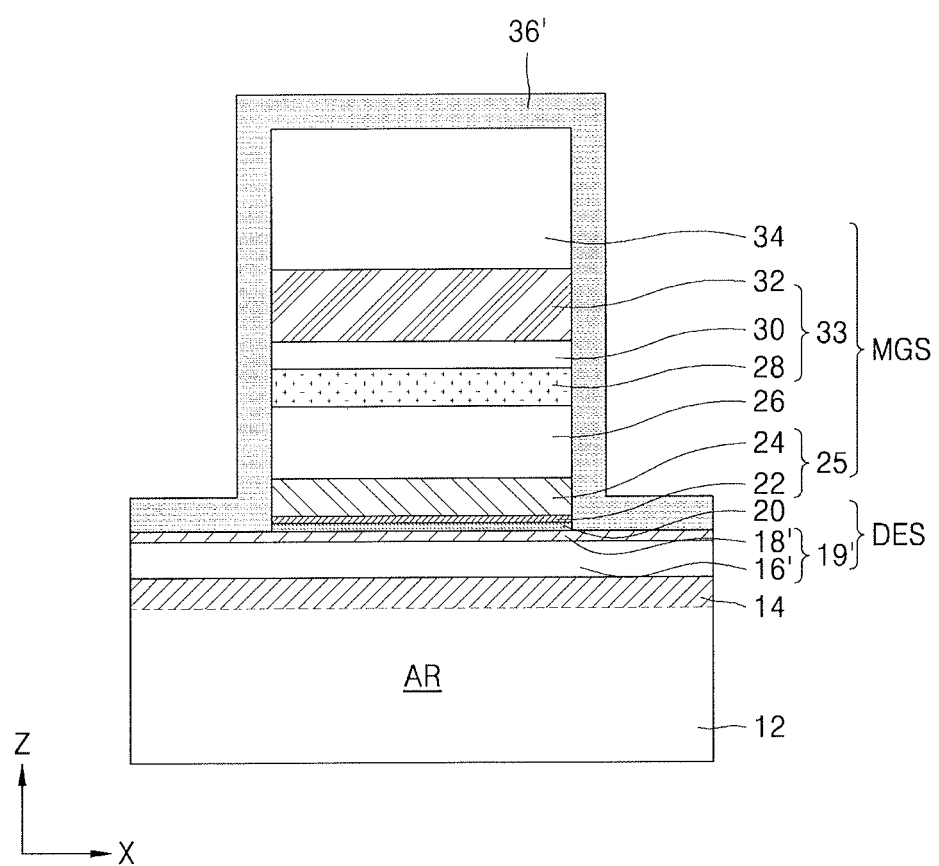
FIGS. 8A to 8D illustrate cross-sectional views of stages in a method of manufacturing an integrated circuit device, according to an embodiment.

Referring to FIG. 8A, on the base layers 12 and 14 including the semiconductor substrate 12 and the semiconductor layer 14, the gate insulating layer DES, which includes a first dielectric material layer 19' and the second dielectric layer 20, and the gate structure MGS are sequentially formed.

The semiconductor layer 14 may be formed on the semiconductor substrate 12. The semiconductor layer 14 may be a material layer capable of improving the carrier mobility. On the semiconductor layer 14, the first dielectric material layer 19' and the second dielectric layer 20 are formed. The first dielectric material layer 19' may be a dielectric layer, e.g., a silicon oxide layer, which has the first relative permittivity.

The first dielectric material layer 19' may be formed by forming an interface material layer 18' on a sub-dielectric material layer 16'. The sub-dielectric material layer 16' may have a greater thickness than the interface material layer 18'. The second dielectric layer 20 may include a high-k dielectric layer which has the second relative permittivity greater than the first relative permittivity, e.g., HfO.

The gate structure MGS is formed on the gate insulating layer DES. The gate structure MGS may include the work function control layer 25, the first gate layer 26, the second gate layer 33, and the capping layer 34. The work function control layer 25 may include the first work function control layer 22 and the second work function control layer 24. The second gate layer 33 may include the barrier metal layers 28 and 30 and the metal layer 32. In a patterning process for forming the gate structure MGS, the second dielectric material layer is etched, and thus, the second dielectric layer 20 may not be formed on portions of the first dielectric material layer 19' that are above both sides of the semiconductor substrate 12.

Continuously, on the entire surfaces of the base layers 12 and 14 on which the gate insulating layer DES and the gate structure MGS are formed, a first spacer material layer 36' is formed. The first spacer material layer 36' is formed, e.g., conformally, on a surface of the first dielectric material layer 19' and both side walls and a top surface of the gate structure MGS. The first spacer material layer 36' may be a dielectric layer, e.g., a silicon nitride layer, which has the third relative permittivity greater than the first relative permittivity.

Figure 8B:
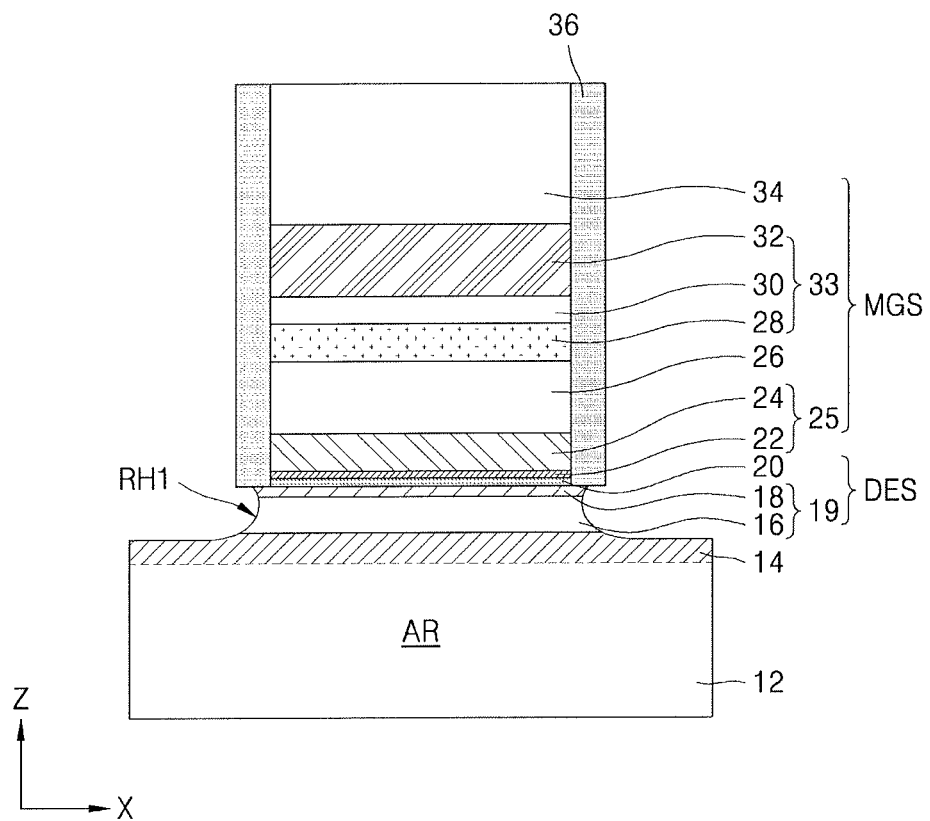

Referring to FIG. 8B, the first spacer material layer 36' is anisotropic-etched, e.g., so horizontal portions of the first spacer material layer 36' may be removed together with portions of the gate insulating layer DES thereunder. As a result, the first dielectric layer 19 is formed under the gate structure MGS and lower portions of the first spacer 36, and the second dielectric layer 20 is formed between the first dielectric layer 19 and the gate structure MSG. The first dielectric layer 19 may include the interface layer 18 formed on the sub-dielectric layer 16. Due to the above process of forming the gate structure MGS and etching the first spacer material layer 36', the first spacers 36 may be formed on both side walls of the gate structure MSG and the second dielectric layer 20.

Continuously, both end portions of the first dielectric layer 19, which are exposed by the gate structure MGS, are further etched to form the recess hole RH1. The recess hole RH1 may be recessed into the gate insulating layer DES, i.e., the first dielectric layer 19, which is on the base layers 12 and 14 and under the first spacer 36. The recess hole RH1 may be an undercut area, e.g., to expose a portion of a bottom surface of the first spacer 36.

FIG. 8B shows that the first spacer 36 and the recess hole RH1 are formed by performing separate processes, e.g., via two separate etching processes. However, the recess hole RH1 may be formed while the first spacer 36 is formed, e.g., via a same etching process.

Figure 8C:
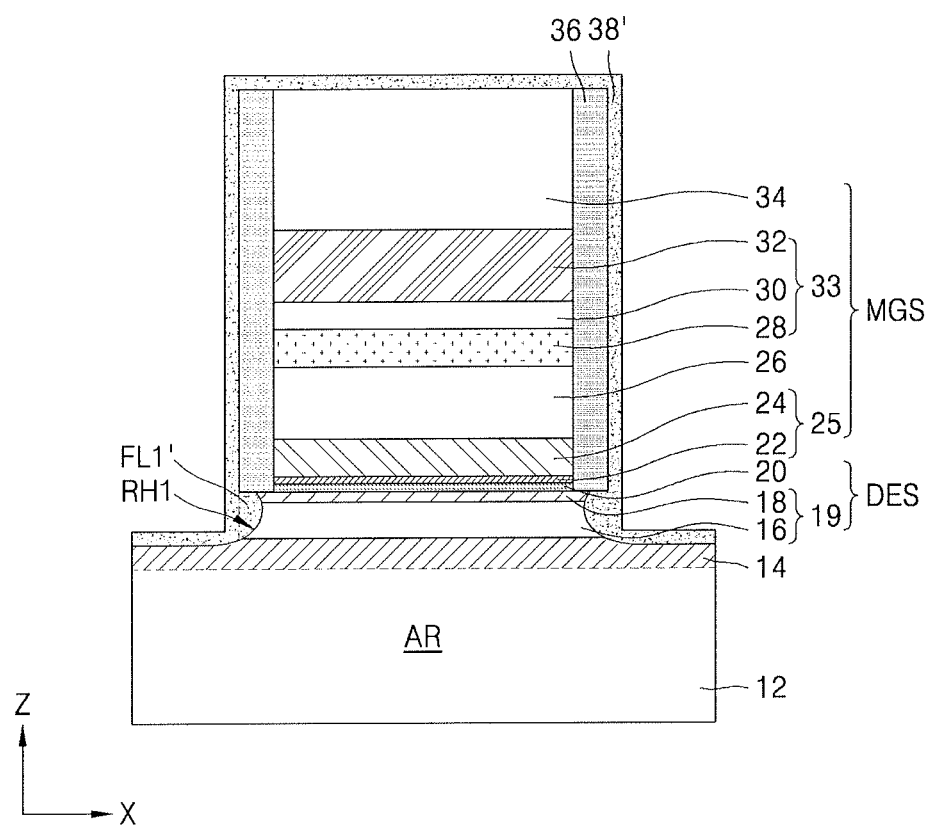

Referring to FIG. 8C, a second spacer material layer 38' and a buried dielectric material layer FL1' are simultaneously formed to bury the recess hole RH1 into the base layer 14, i.e., the entire surface of the semiconductor layer 14, on which the gate insulating layer DES, the gate structure MGS, and the first spacer 36 are formed. The buried dielectric material layer FL1' is used to bury the recess hole RH1. For example, as illustrated in FIG. 8C, during formation of the second spacer material layer 38', the recess hole RH1 may be, e.g., completely, filled to form the buried dielectric material layer FL1' to have an external sidewall of the buried dielectric material layer FL1' level with an external sidewall of the first spacer 36. For example, as further illustrated in FIG. 8C, the second spacer material layer 38' may extend on the external sidewall of the buried dielectric material layer FL1'. It is noted that the dashed line in FIG. 8C indicating the external sidewall of the buried dielectric material layer FL1' is an imaginary line added for convenience.

The second spacer material layer 38' is formed on a sidewall of the first spacer 36, a sidewall of the buried dielectric material layer FL1', and a top surface of the gate structure MGS. The second spacer material layer 38' and the buried dielectric material layer FL1' may be integrally formed, e.g., as a single and seamless structure formed in a same process, and may include the same material. The second spacer material layer 38' and the buried dielectric material layer FL1' may include the same material as the first dielectric layer 19.

Figure 8D:
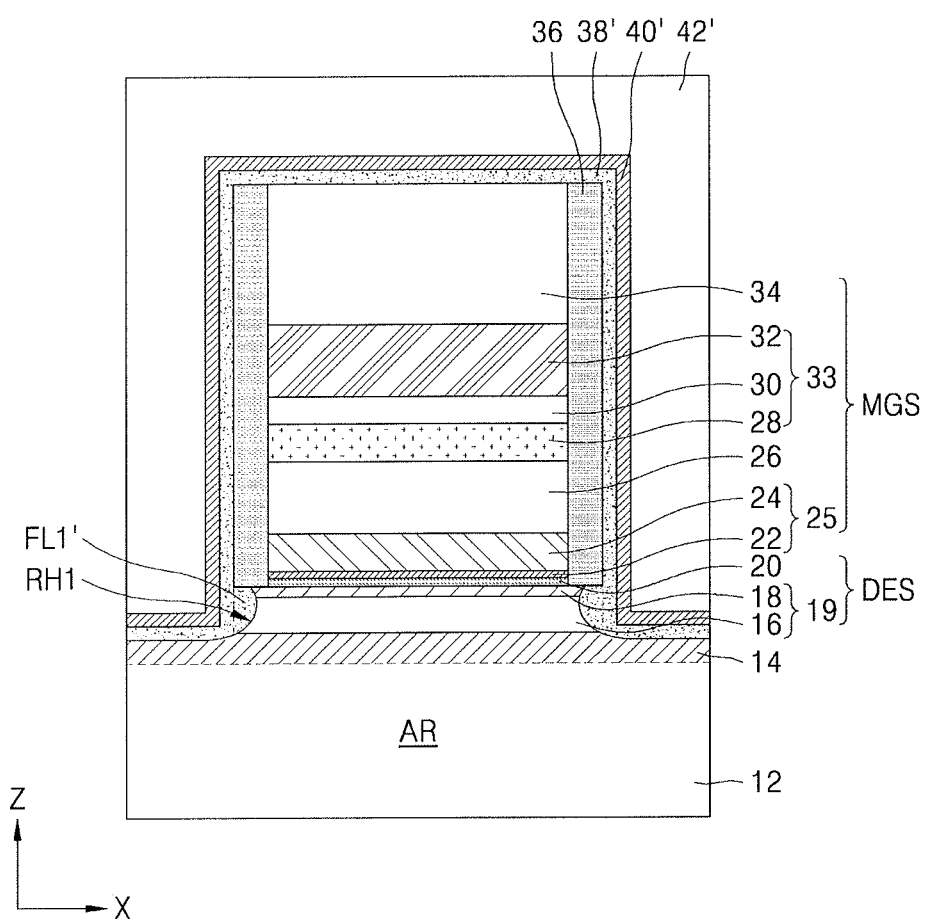

Referring to FIG. 8D, a third spacer material layer 40' and a fourth spacer material layer 42' are sequentially formed on the base layers 12 and 14, i.e., the entire surface of the semiconductor layer 14, on which the second spacer material layer 38' and the buried dielectric material layer FL1' are formed. On the second spacer material layer 38', the third spacer material layer 40' and the fourth spacer material layer 42' are sequentially formed. The third spacer material layer 40' includes the same material as the first spacer 36. The fourth spacer material layer 42' includes the same material as the second spacer material layer 38'.

Then, the fourth spacer material layer 42', the third spacer material layer 40', and the second spacer material layer 38' are anisotropic-etched. In this case, as shown in FIG. 2, the second spacer 38 having the L shape and the third spacer 40 having the L shape are formed on one side wall of the first spacer 36. Moreover, on the wall and the upper portion of the third spacer 40, the fourth spacer 42 having the greater width than the first spacer 36, the second spacer 38, and the third spacer 40 is formed. Accordingly, the gate spacer structures SPG1 are formed on the side walls of the gate insulating layer DES and the gate structure MGS.

Then, the source area 44 and the drain area 46 are formed by injecting impurities into the base layers 12 and 14 under the gate spacer structures SPG1 and the side walls of the gate insulating layer DES and the gate structure MGS.

Figure 9A:
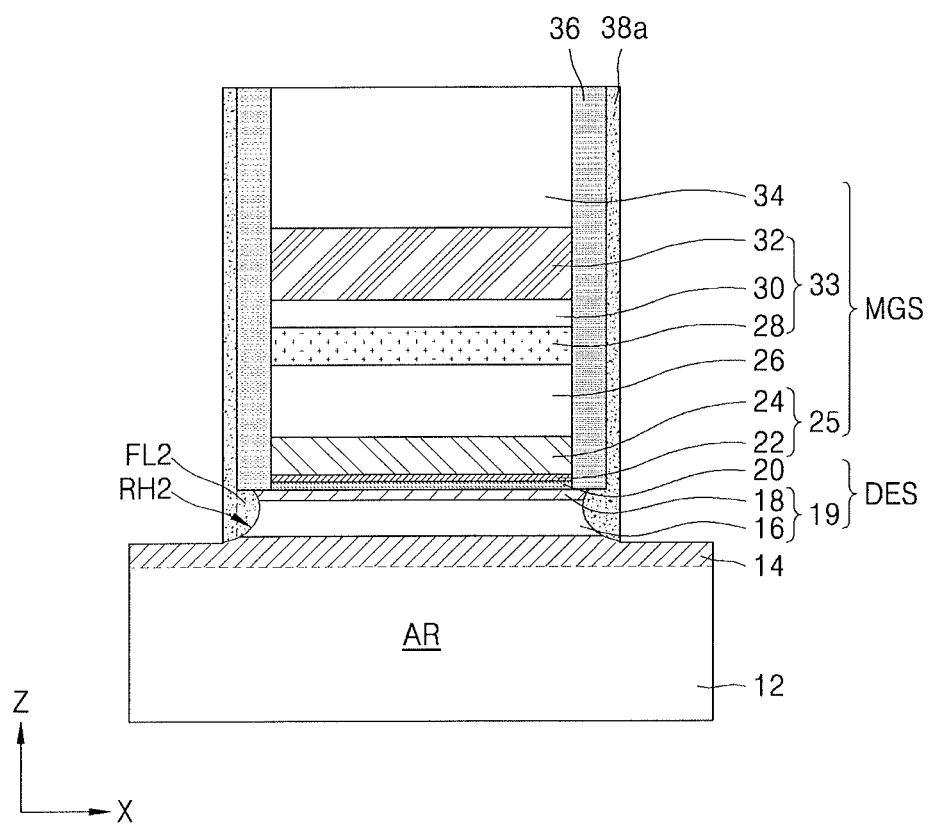
FIGS. 9A and 9B illustrate cross-sectional views of stages in a method of manufacturing an integrated circuit device according to an embodiment.
Figure 9B:
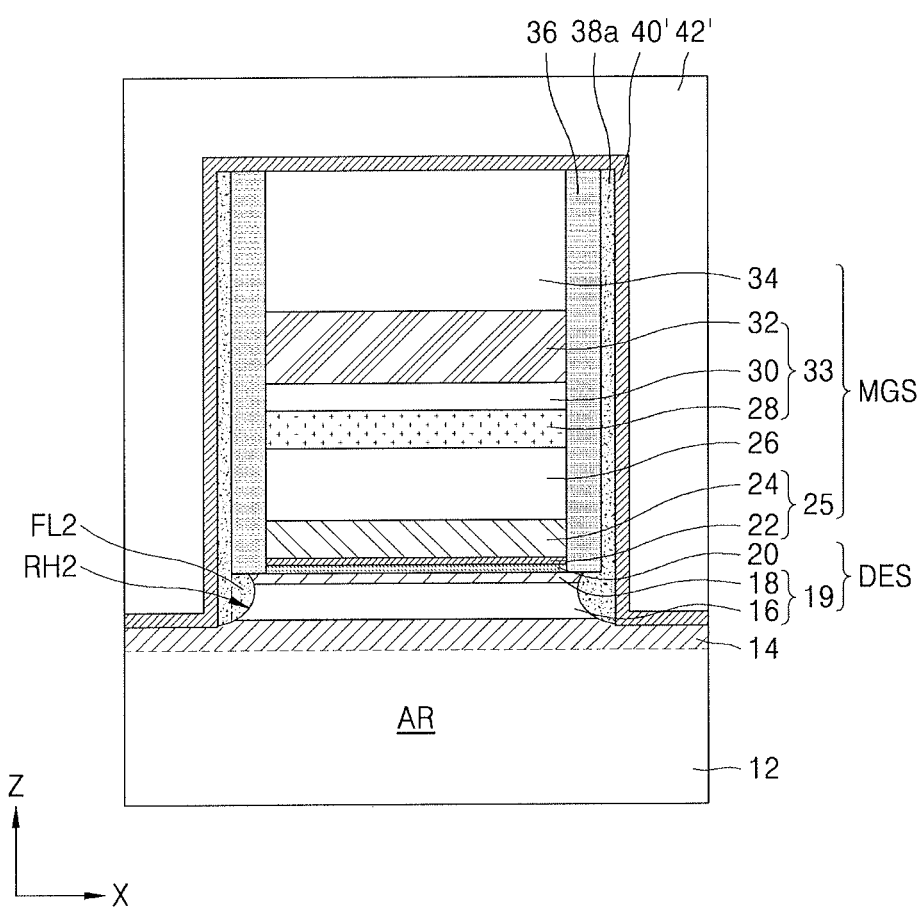

FIGS. 9A and 9B are cross-sectional views for explaining a method of manufacturing an integrated circuit device, according to an embodiment.

In particular, FIGS. 9A and 9B are provided to explain a method of manufacturing the integrated circuit device 2 of FIGS. 4 and 5. The descriptions that are already provided with reference to FIGS. 4 and 5 will be only briefly provided or omitted herein. In addition, the descriptions that are already provided with reference to FIGS. 8A to 8D will be only briefly provided or omitted herein.

As described above, the manufacturing processes of FIGS. 8A to 8C are performed. In this case, the first spacers 36 are formed on both side walls of the gate structure MGS. The recess hole RH1 is formed in the lower portions of the first spacers 36 and on a sidewall of the first dielectric layer 19. The second spacer material layer 38' and the buried dielectric material layer FL1' are simultaneously formed to bury the recess hole RH1 in the base layer 14, i.e., the entire surface of the semiconductor layer 14, on which the gate insulating layer DES, the gate structure MGS, and the first spacers 36 are formed. The buried dielectric material layer FL1' is used to bury the recess hole RH1.

Referring to FIG. 9A, the second spacer material layer 38' is anisotropically-etched to form the second spacers 38a. In this case, the buried dielectric layer FL2 is formed in the recess hole RH2. In addition, the second spacer 38a is formed on a wall of the first spacer 36 and a wall of the buried dielectric layer FL2. The second spacer 38a is formed in an I shape. In FIG. 9A reference numerals of the recess hole RH1 and the buried dielectric layer FL1 are changed to RH2 and FL2 for comparison with FIGS. 8B and 8C.

Referring to FIG. 9B, the third spacer material layer 40' and the fourth spacer material layer 42' are sequentially formed on the base layers 12 and 14, i.e., the entire surface of the semiconductor layer 14, on which the first spacer 36, the second spacer 38a, and the buried dielectric layer FL2 are formed. The third spacer material layer 40' may include the same material as the first spacer 36. The fourth spacer material layer 42' may include the same material as the second spacer 38a.

Then, the fourth spacer material layer 42' and the third spacer material layer 40' are anisotropically-etched. In this case, as shown in FIG. 4, on one side wall of the first spacer 36, the second spacer 38a having the I shape and the third spacer 40 having the L shape are formed. In addition, the fourth spacer 42 having a greater width than the first spacer 36, the second spacer 38a, and the third spacer 40 is formed on the wall and the upper portion of the third spacer 40. Accordingly, the gate spacer structures SPG2 are formed on the side walls of the gate insulating layer DES and the gate structure MGS.

Continuously, the source area 44 and the drain area 46 are formed by injecting impurities into the base layers 12 and 14 under the gate spacer structures SPG2 and the side walls of the gate insulating layer DES and the gate structure MGS.

Figure 10A:
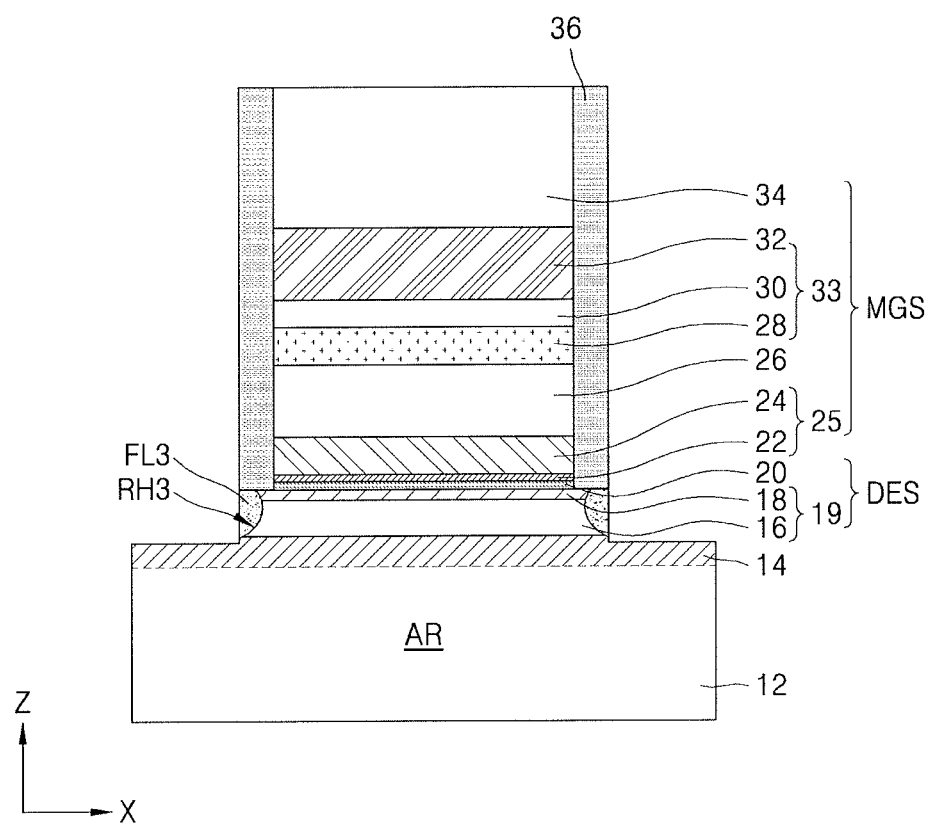
FIGS. 10A and 10B illustrate cross-sectional views of stages in a method of manufacturing an integrated circuit device, according to an embodiment.
Figure 10B:
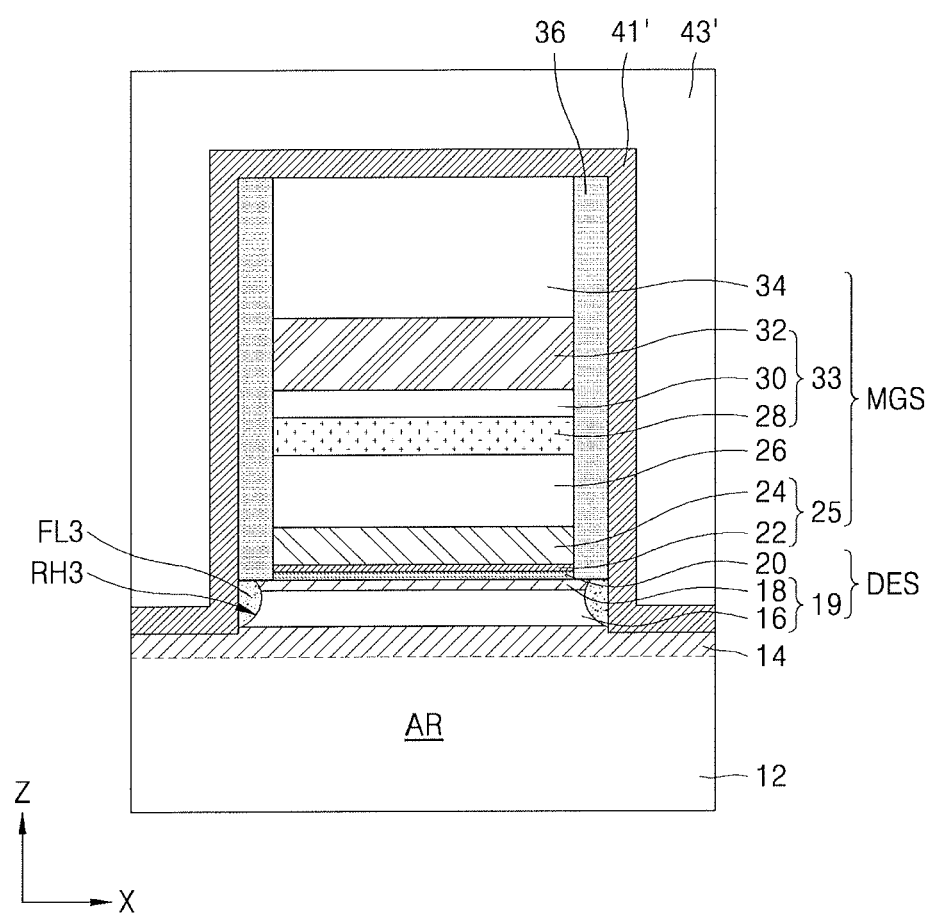

FIGS. 10A and 10B are cross-sectional views for explaining a method of manufacturing an integrated circuit device, according to an embodiment. In particular, FIGS. 10A and 10B are provided to explain a method of manufacturing the integrated circuit device 3 of FIGS. 6 and 7. The descriptions that are already provided with reference to FIGS. 6 and 7 will be only briefly provided or omitted herein. The descriptions that are already provided with reference to FIGS. 8A to 8D will be only briefly provided or omitted herein.

As described above, the manufacturing processes of FIGS. 8A and 8B are performed. In this case, the first spacers 36 are formed on the side walls of the gate structure MGS. In addition, the recess hole RH1 is formed in the lower portion of the first spacer 36 and the wall of the first dielectric layer 19.

Referring to FIG. 10A, the buried dielectric layer FL3 is formed to bury the recess hole RH3. For comparison with FIGS. 8B and 8C, reference numerals of the recess hole RH1 and the buried dielectric layer FL1 of FIG. 10A are changed to RH3 and FL3, respectively.

The buried dielectric layer FL3 may be formed by forming and anisotropic-etching a buried dielectric material layer used to bury the recess hole RH3 in the base layer, i.e., the entire surface of the semiconductor layer 14, on which the gate insulating layer DES, the gate structure MGS, and the first spacer 36 are formed. The buried dielectric layer FL3 may include the same material as the first dielectric layer 19.

Referring to FIG. 10B, a second spacer material layer 41' and a third spacer material layer 43' are sequentially formed on the base layers 12 and 14, i.e., the entire surface of the semiconductor layer 14, on which the first spacer 36 and the buried dielectric layer FL3 are formed. The second spacer material layer 41' may include the same material as the first spacer 36. The third spacer material layer 43' may include the same material as the first dielectric layer 19.

Then, the third spacer material layer 43' and the second spacer material layer 41' are anisotropically-etched. In this case, as shown in FIG. 6, the second spacer 41 having the L shape is formed on the wall of the first spacer 36. In addition, the third spacer 43 having a greater width than the first spacer 36 and the second spacer 41 is formed on the wall and the upper portion of the second spacer 41. Accordingly, the gate spacer structures SPG3 are formed on the side walls of the gate insulating layer DES and the gate structure MGS.

Continuously, the source area 44 and the drain area 46 are formed by injecting impurities into the base layers 12 and 14 under the gate spacer structures SPG3 and the side walls of the gate insulating layer DES and the gate structure MGS.

Hereinafter, a structure of a memory device and a method of manufacturing the same will be described as an application example of the above-described integrated circuit devices.

Figure 11:
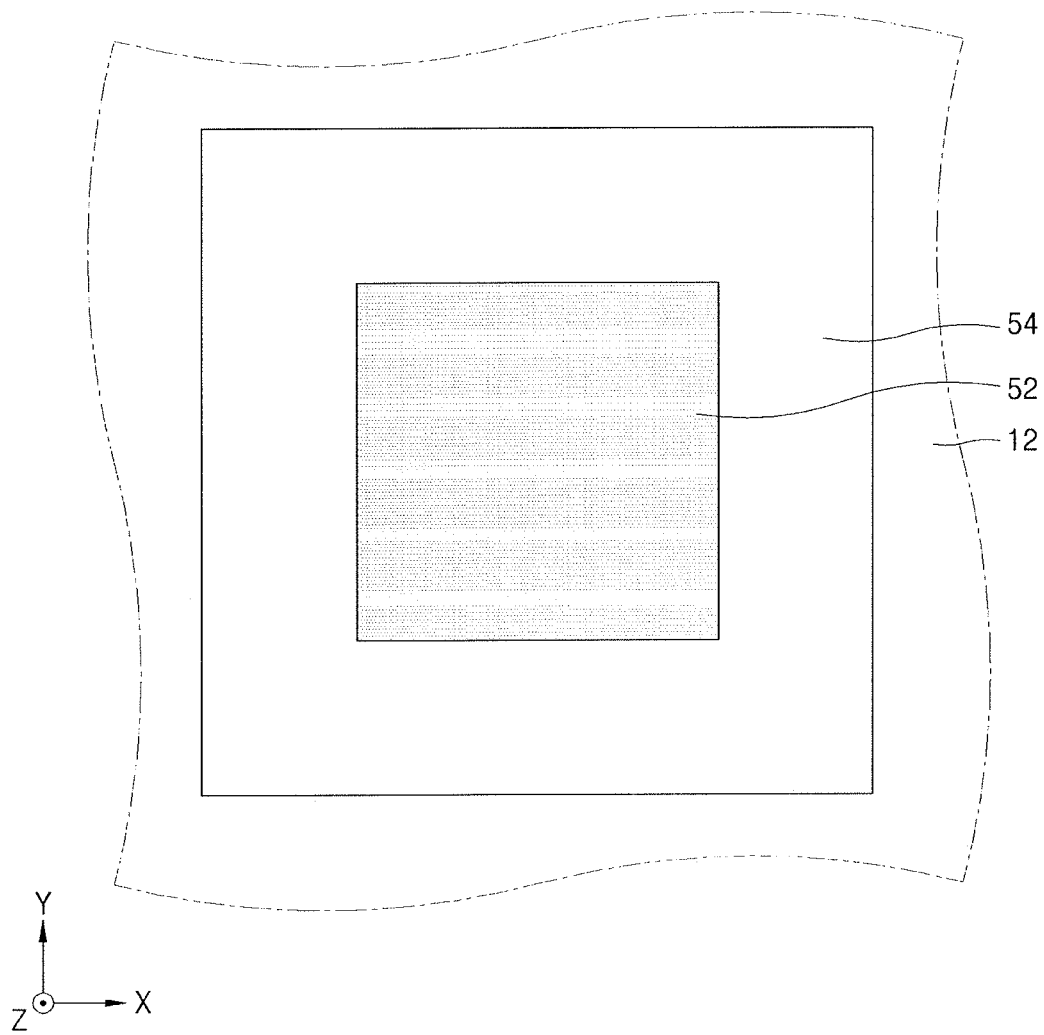
FIG. 11 illustrates a plan view of a schematic structure of a memory device, according to an embodiment.

FIG. 11 is a plan view showing a schematic structure of a memory device 50, according to an embodiment.

In particular, the memory device 50 may be a dynamic random access memory (DRAM) device. The memory device 50 may include the semiconductor substrate 12 having a first area 52 and a second area 54 surrounding the first area 52.

The first area 52 may be a memory cell area that includes a memory cell array including multiple memory cells. The first area 52 may be a memory cell area of the DRAM device. The memory cell may include a transistor and a capacitor.

The second area 54 may be a core area or a peripheral circuit area (hereinafter, collectively referred to as a "peripheral circuit area"). In the second area 54, there may be aligned peripheral circuits that are necessary to drive the memory cells in the first area 52. The second area 54 may be the peripheral circuit area of the DRAM device.

Figure 12:
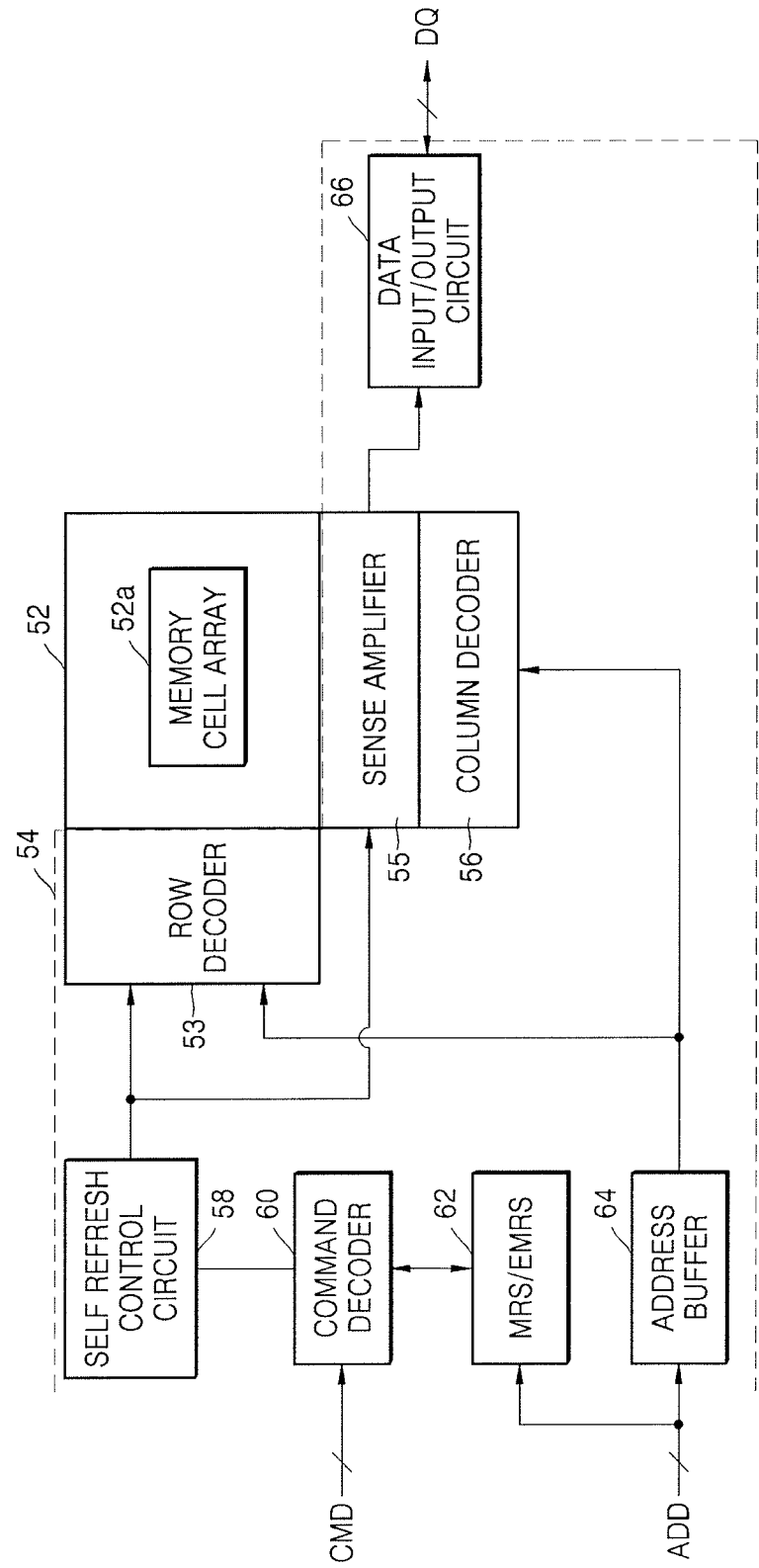
FIG. 12 illustrates a block diagram of an exemplary structure of a memory device, according to an embodiment.

FIG. 12 is a block diagram for explaining an exemplary structure of the memory device 50, according to an embodiment.

In particular, the memory device 50 of FIG. 12 is provided to explain the exemplary structure of the DRAM device. In the memory device 50 the first area 52 may be the memory cell area of the DRAM device, and the second area 54 may be the peripheral circuit area of the DRAM device.

The first area 52 may include a memory cell array 52A. In the memory cell array 52A, the memory cells for storing data may be aligned in a row direction and a column direction. The memory cells may each include a cell capacitor and an access transistor. A gate of the access transistor may be connected to a corresponding one of word lines aligned in the row direction. One of a source and a drain of the access transistor may be connected to a corresponding one of bit lines or complementary bit lines which are aligned in the column direction, and the other thereof may be connected to a cell capacitor.

The second area 54 may include a row decoder 53, a sense amplifier 55, a column decoder 56, a self-refresh control circuit 58, a command decoder 60, a mode register set/extended mode register set (MRS/EMRS) circuit 62, an address buffer 64, and a data input/output circuit 66.

The sense amplifier 55 may sense and amplify data of the memory cells and may store the data in the memory cells. The sense amplifier 55 may be embodied as a cross-coupled amplifier connected between the bit lines and the complementary bit lines included in the memory cell array 52A.

Data DQ that is input through the data input/output circuit 66 may be written to the memory cell array 52A in response to address signals ADD, and data DQ that is read from the memory cell array 52A may be output to the outside through the data input/output circuit 66 in response to the address signals ADD. The address signals ADD may be input to the address buffer 64 to designate memory cells to/from which the data DQ is written/read. The address buffer 64 may temporarily store the address signals ADD that are input from the outside.

The row decoder 53 may decode a row address among the address signals ADD, which are output from the address buffer 64, to designate word lines connected to the memory cells to/from the data DQ is input/output. That is, the row decoder 53 may enable a corresponding word line by decoding the row address that is output from the address buffer 64 in a data write or read mode. Also, the row decoder 53 may enable a corresponding word line by decoding the row address generated by an address counter in a self-refresh mode.

The column decoder 56 may decode a column address among the address signals ADD that are output from the address buffer 64 in order to designate bit lines connected to the memory cells to or from the data DQ is input or output. The memory cell array 52A may output the data DQ from the memory cells designated by the row and column addresses or may write the data DQ to the memory cells.

The command decoder 60 may receive command signals CMD that are transmitted from the outside, decode the command signals CMD, and internally generate decoded command signals CMD, e.g., self-refresh entry commands or self-refresh exit commands. The MRS/EMRS circuit 62 may set a mode register therein, in response to MRS/EMRS commands and the address signals ADD for designating an operation mode of the memory device 50.

The memory device 50 may further include a clock circuit generating clock signals, a power circuit receiving a power voltage applied thereto from the outside and generating or distributing an internal voltage, and the like.

The self-refresh control circuit 58 may control a self-refresh operation of the memory device 50 in response to a command output from the command decoder 60. The command decoder 60 may include an address counter, a timer, and a core voltage generator. The address counter may generate the row address for designating the row address, which is subject to self-refresh, in response to a self-refresh entry command output from the command decoder 60 and may transmit the generated row address to the row decoder 53. The address counter may stop a counting operation in response to the self-refresh exit commands output from the command decoder 60.

Figure 13:
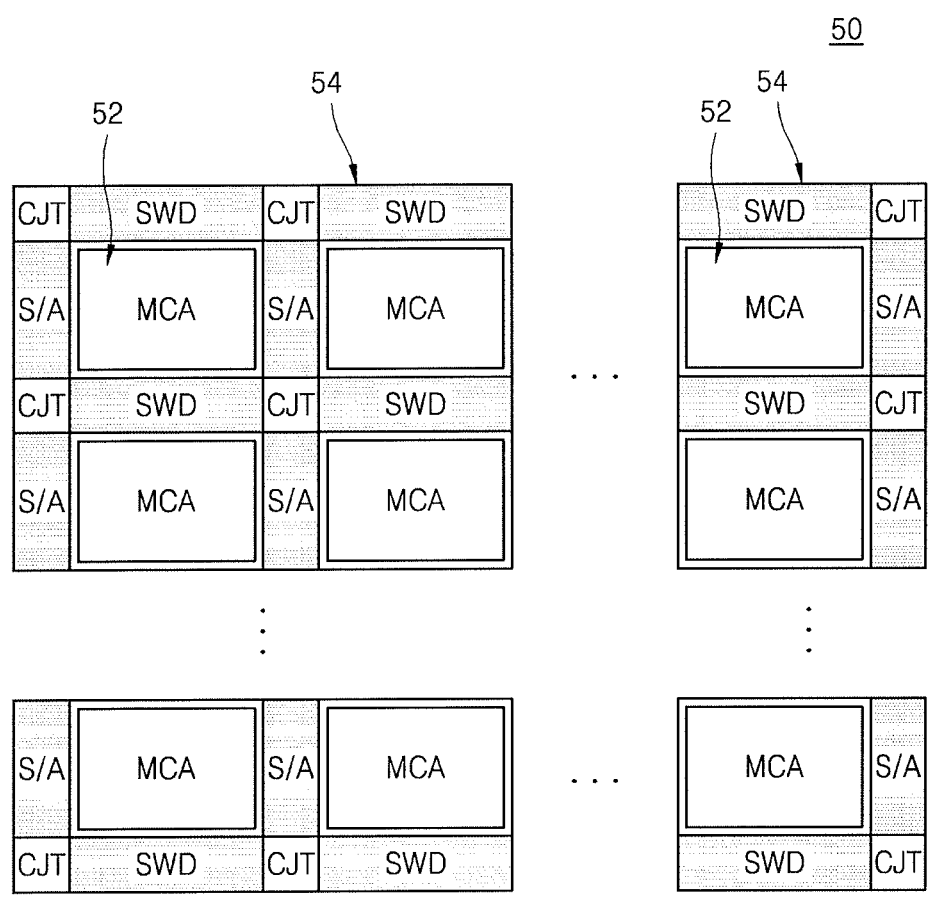
FIG. 13 illustrates a plan view of an exemplary structure of a memory device, according to an embodiment.

FIG. 13 is a plan view of an exemplary structure of the memory device 50, according to an embodiment.

In particular, the memory device 50 is provided to explain an exemplary structure of the DRAM device. The memory device 50 includes multiple first areas 52. The first areas 52 may be surrounded by the second areas 54. The first areas 52 may be memory cell areas including memory cell arrays MCA. The second areas 54 may be peripheral circuit areas.

The second areas 54 may each include a sub-word line driver block SWD, a sense amplifier block S/A, and a conjunction block CJT. In the second areas 54, the sub-word line driver blocks SWD may be aligned in a word line direction of the memory cell arrays MCA, and sense amplifier blocks S/A may be aligned in a bit line direction. In the sense amplifier blocks S/A, bit-line sense amplifiers may be aligned.

The conjunction blocks CJT may be located at points where the sub-word line driver blocks SWD cross the sense amplifier block S/A. In the conjunction blocks CJT, power drivers and ground drivers for driving the bit-line sense amplifiers may be alternately aligned. Although not shown in the drawings, in the second area 54, peripheral circuits such as an inverter chain and an input/output circuit may be further formed.

Figure 14:
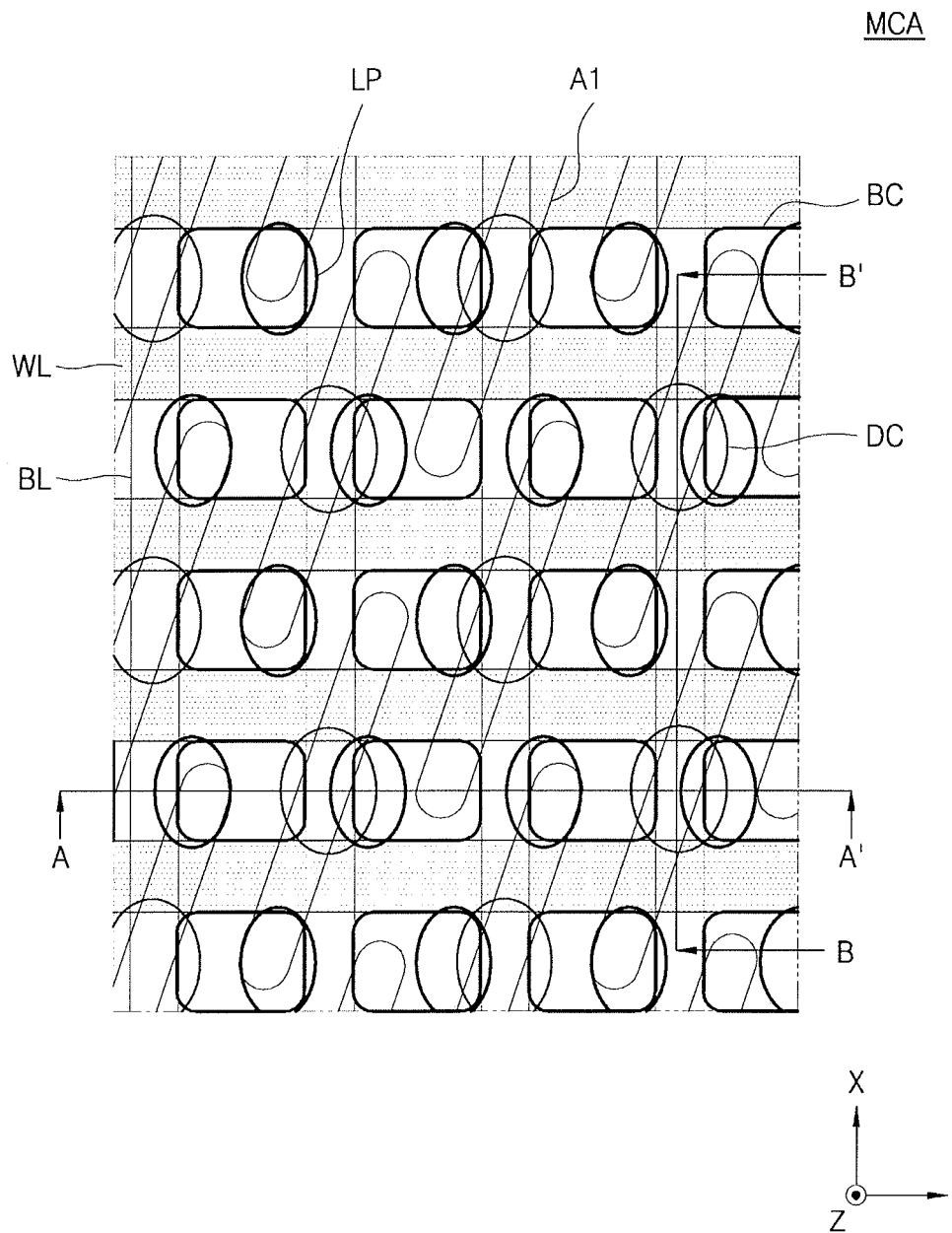
FIG. 14 illustrates a schematic layout of main components of a memory cell array area of FIG. 13.

FIG. 14 is a schematic layout for explaining main components of the memory cell array area MCA of FIG. 13.

In particular, the memory cell array area MCA may include cell active regions A1, e.g., the cell active regions A1 may correspond to active region AR in FIG. 1. The cell active regions A1 may be aligned to have long axes in a diagonal direction with respect to the first direction (the X direction) and the second direction (the Y direction).

Word lines WL may extend in parallel with one another along the first direction (the X direction) by crossing the cell active regions A1. Above the word lines WL, bit lines BL may extend in parallel with one another along the second direction (the Y direction) that crosses the first direction (the X direction). The bit lines BL may be connected to the cell active regions A1 through direct contacts DC.

A buried contact BC may be formed between two bit lines BL which are adjacent to each other from among the bit lines BL. Multiple buried contacts BC may be aligned in a line along the first direction (the X direction) and the second direction (the Y direction). On the buried contacts BC, landing pads LP may be formed. The buried contacts BC and the landing pads LP may connect lower electrodes of capacitors, which are formed above the bit lines BL, to the cell active regions A1. The landing pads LP may partially overlap the buried contacts BC, respectively.

Figure 15A:
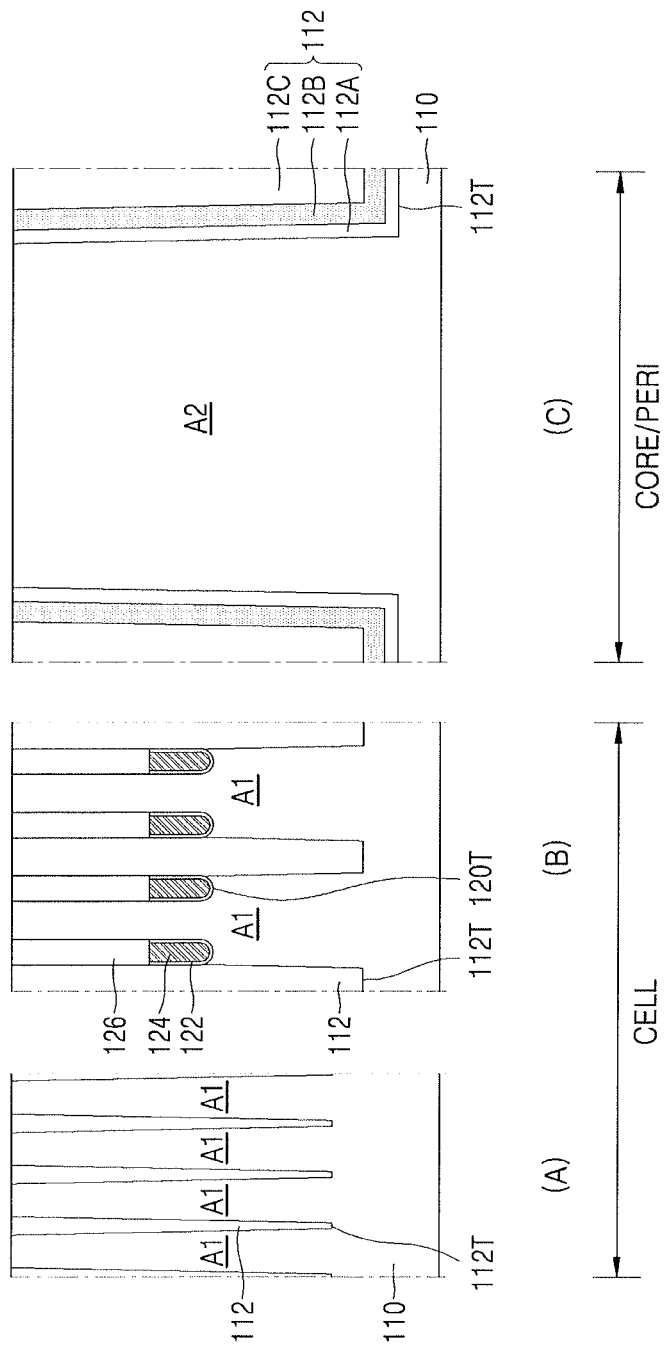
FIGS. 15A to 15Q illustrate cross-sectional views of stages in a method of manufacturing a memory device, according to an embodiment.
Figure 15B:
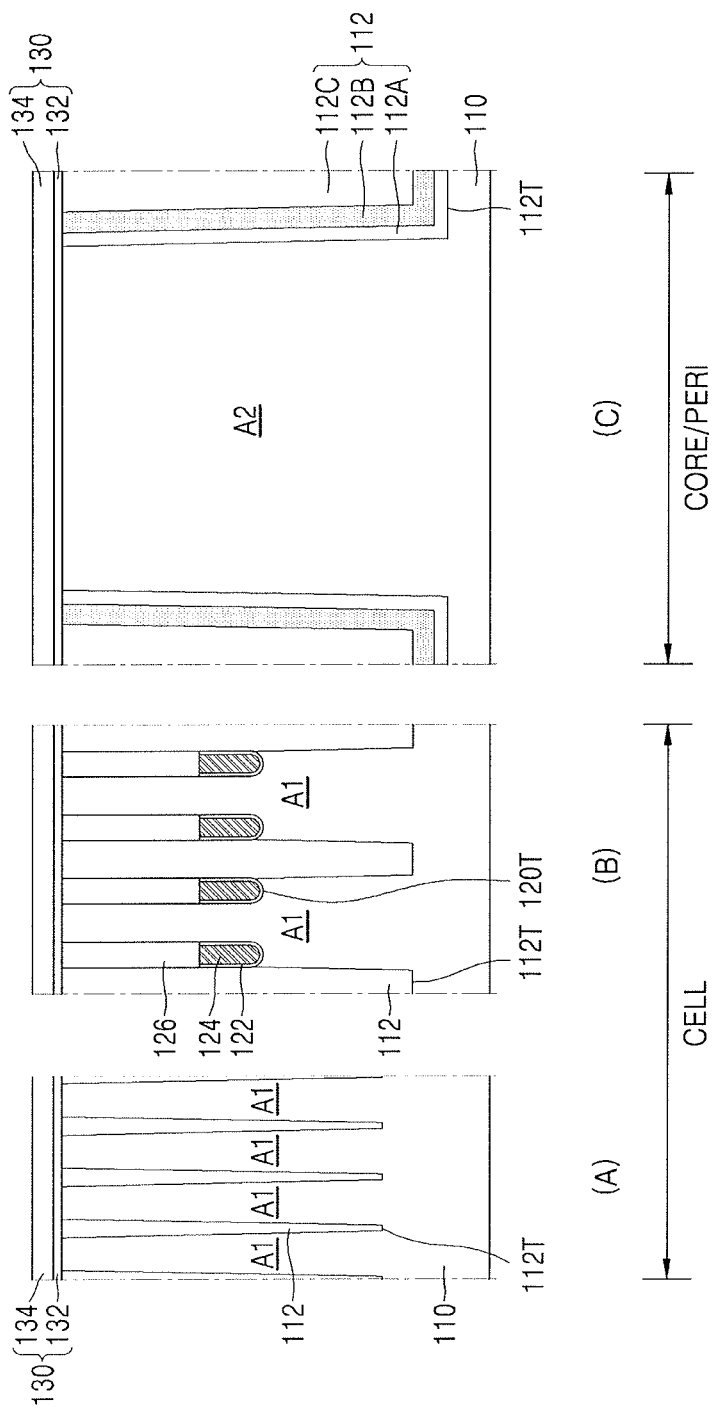
Figure 15C:
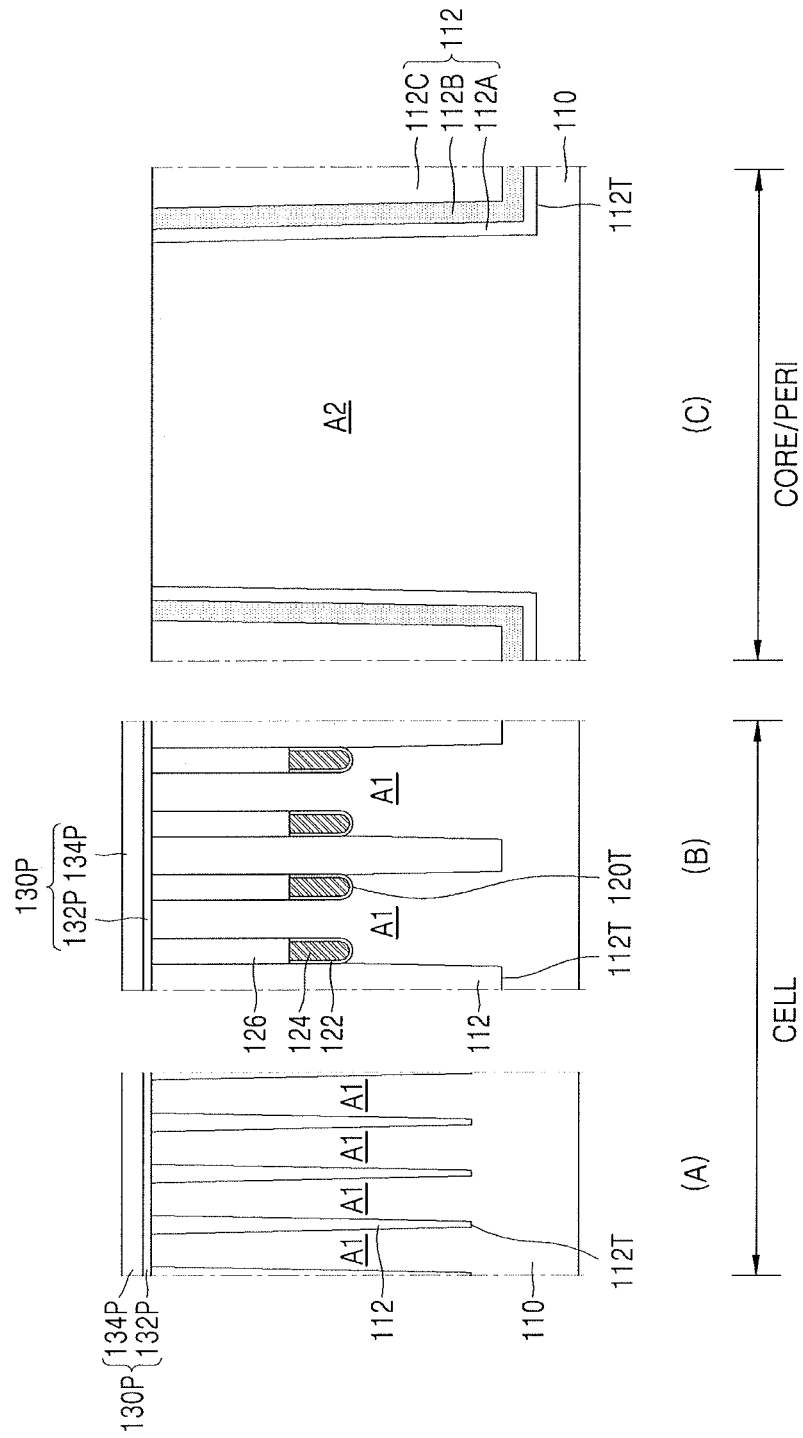
Figure 15D:
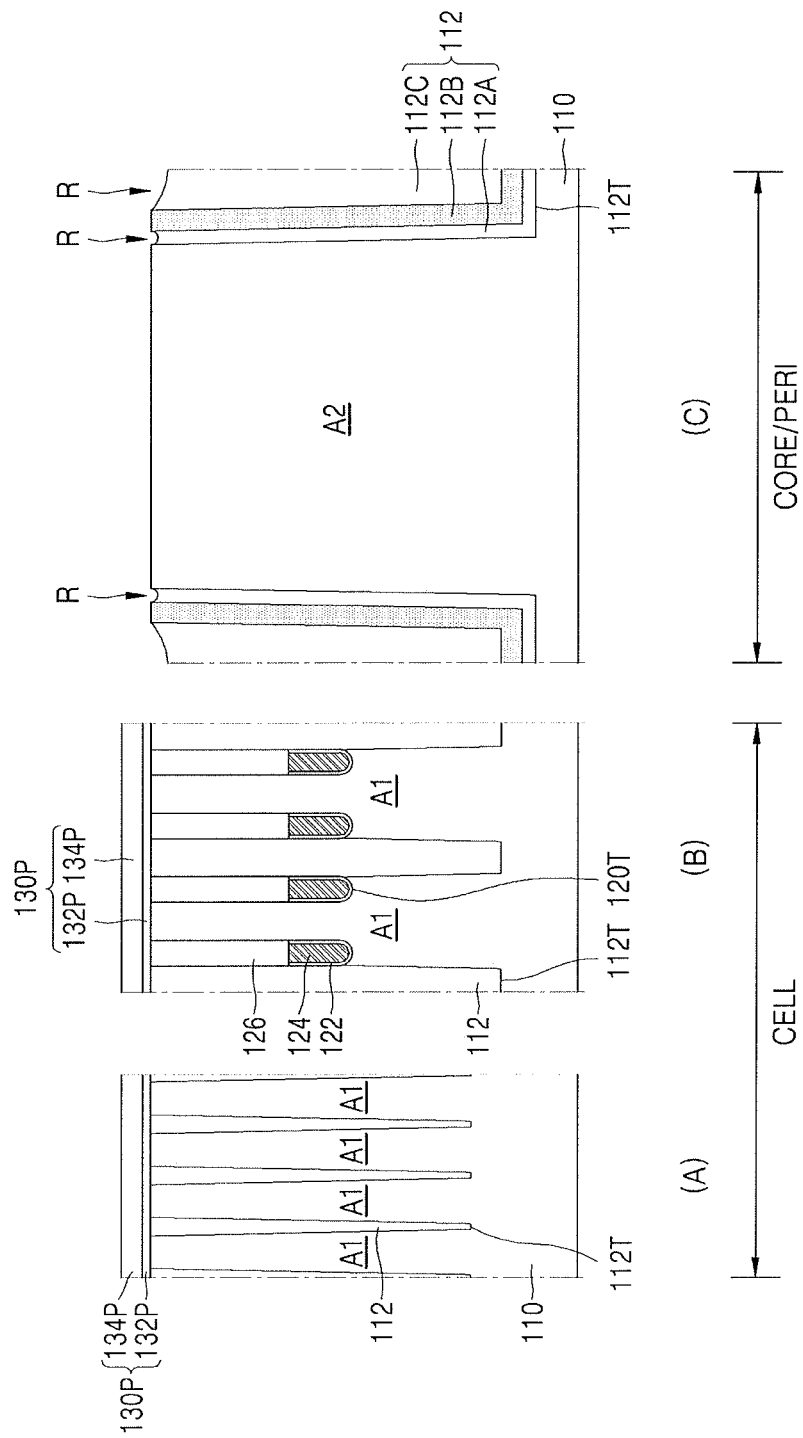
Figure 15E:
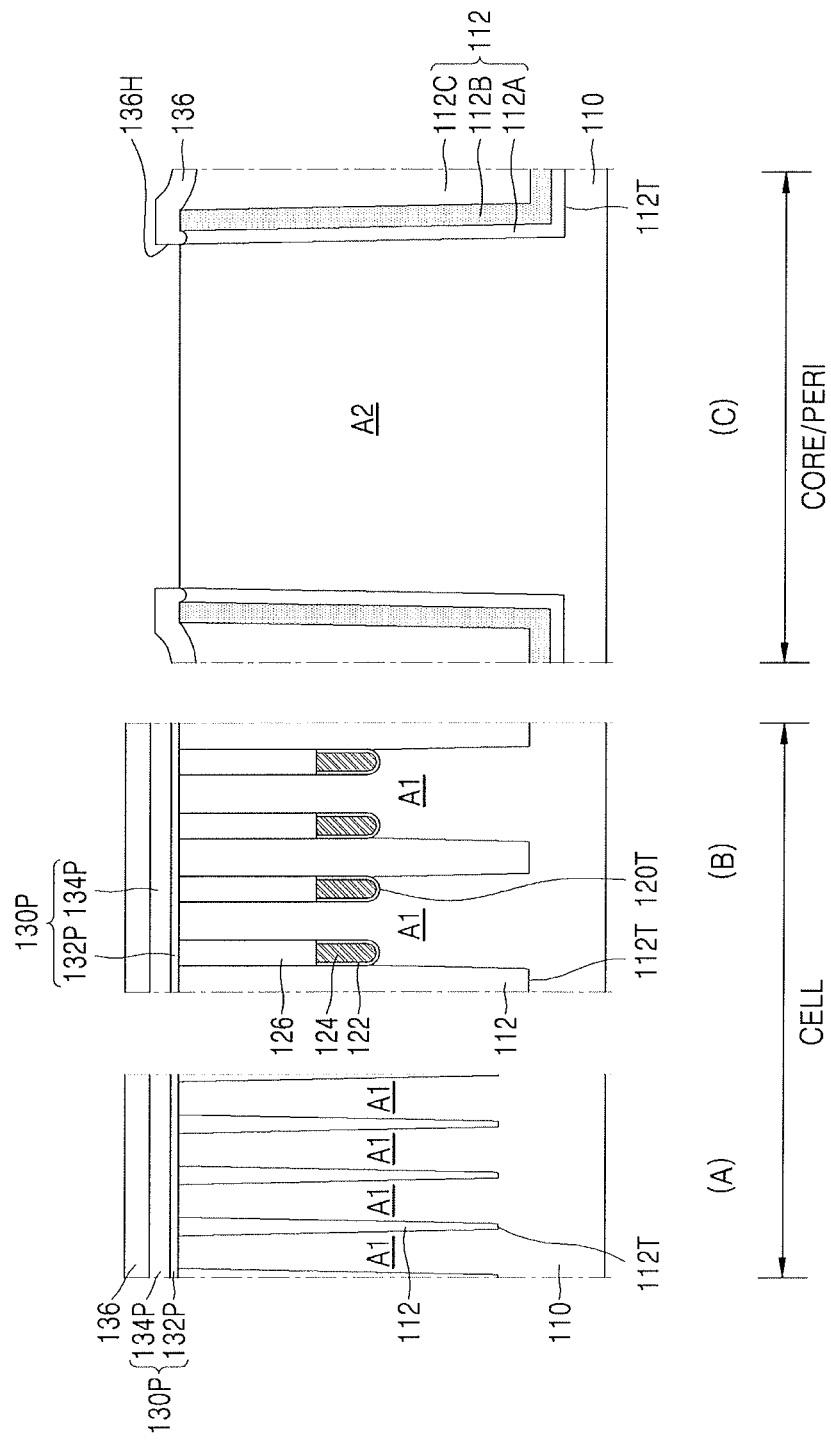
Figure 15F:
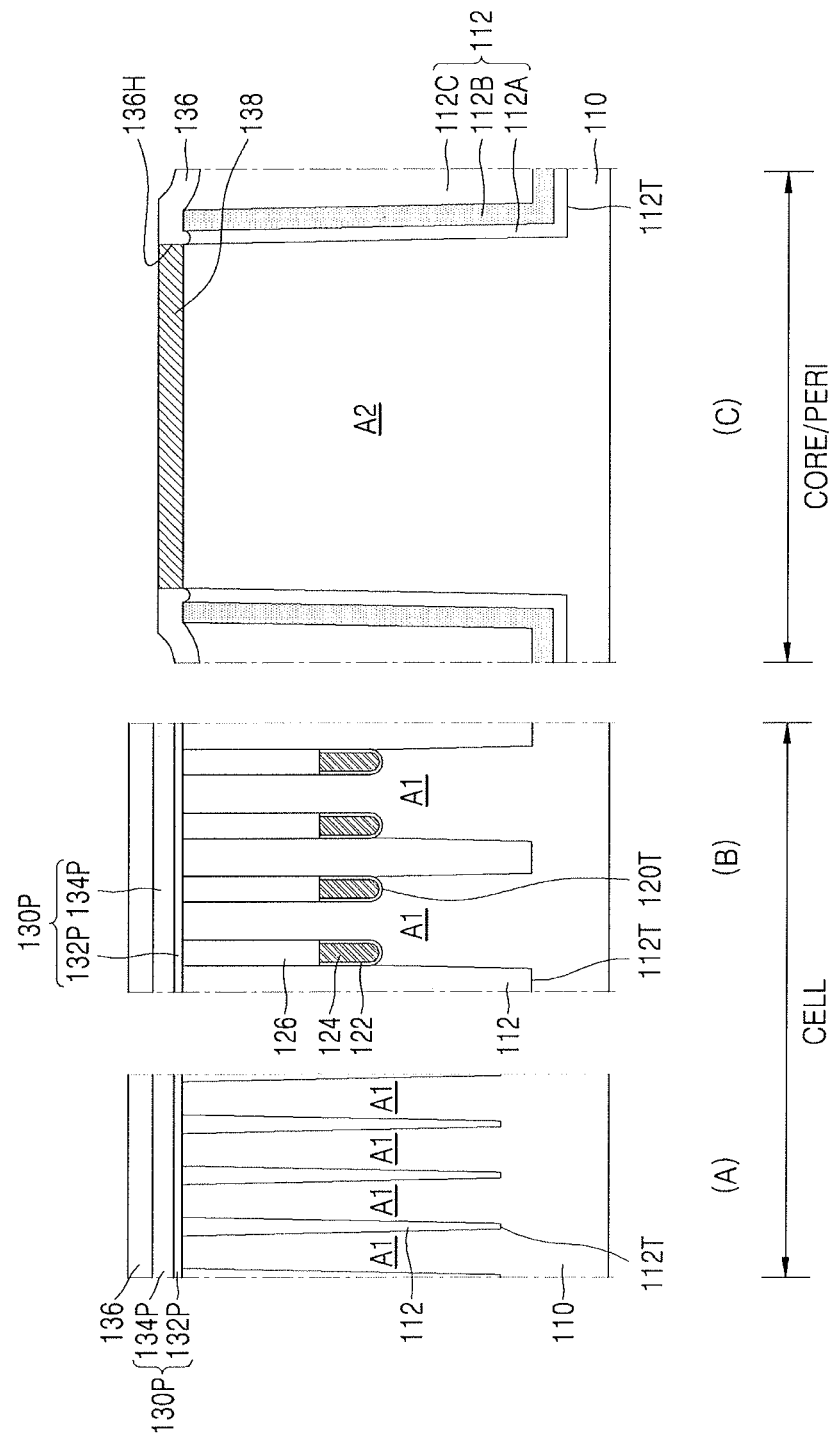
Figure 15G:
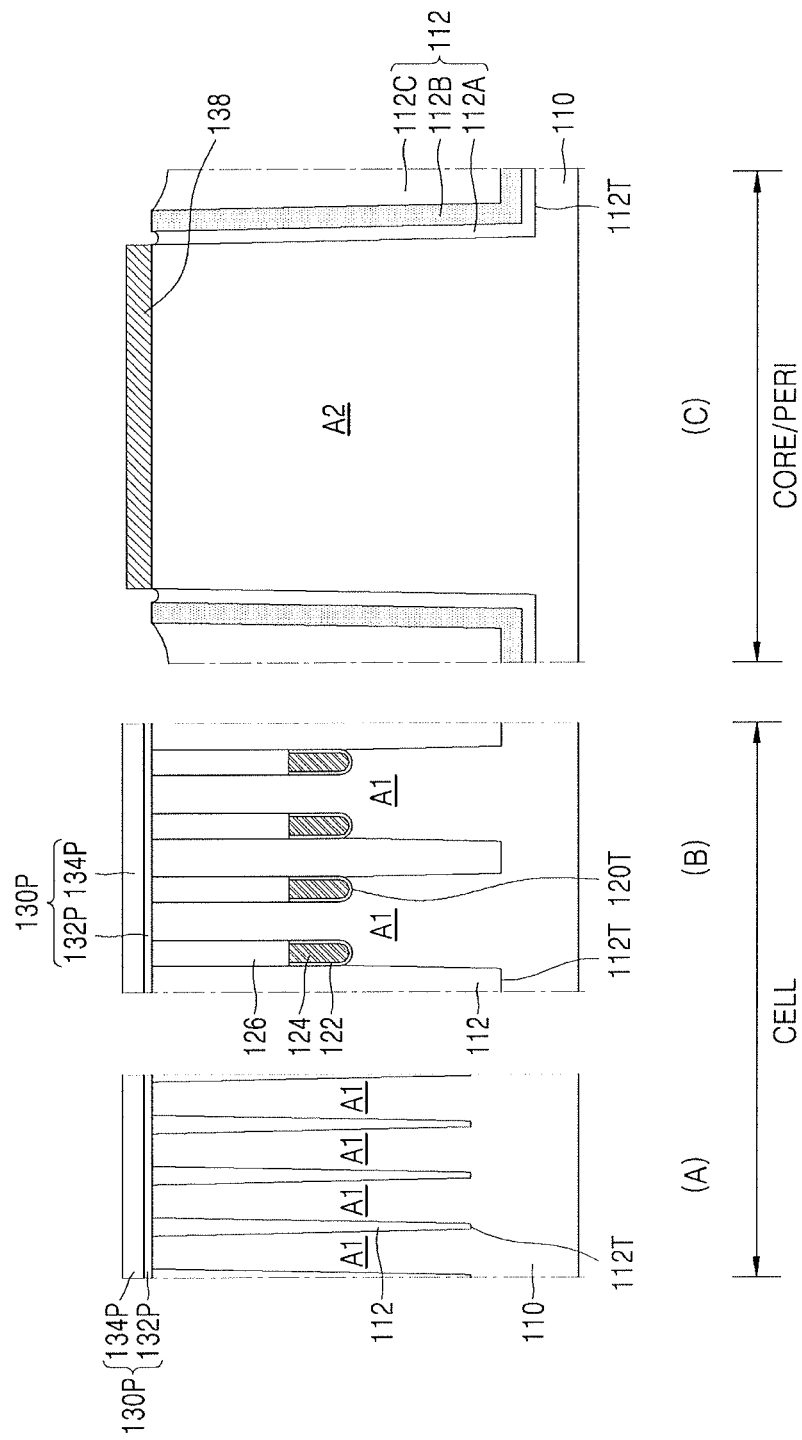
Figure 15H:
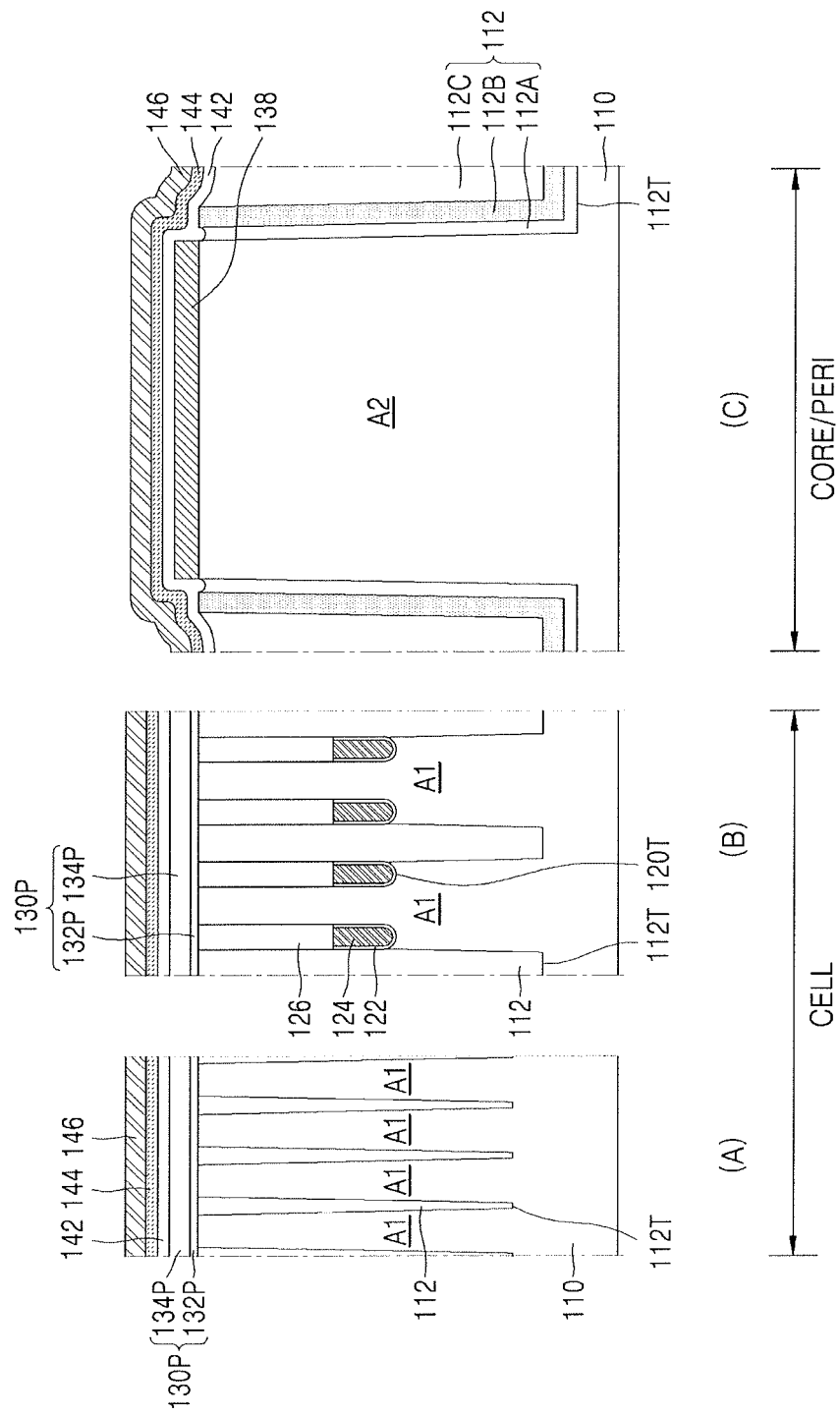
Figure 15I:
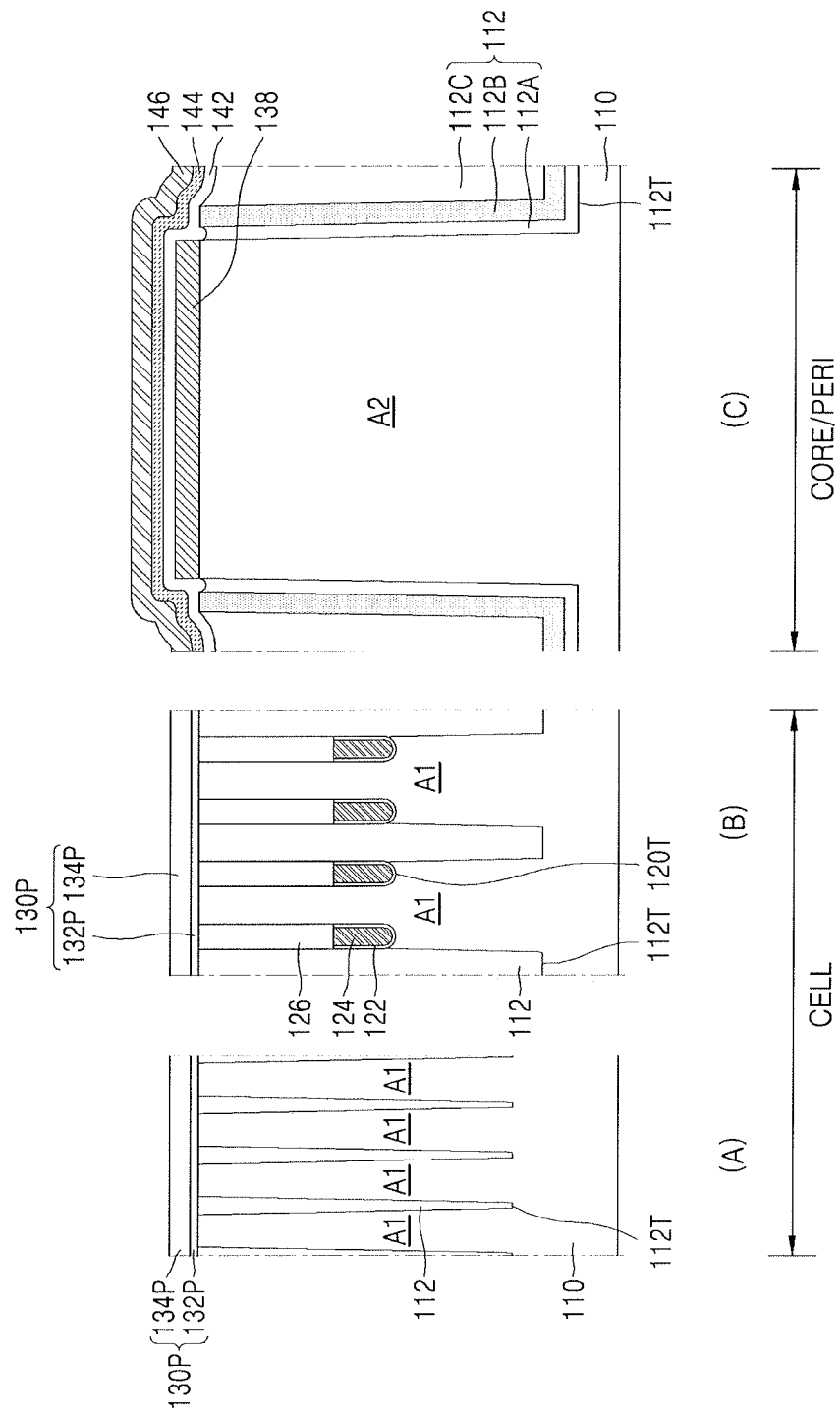
Figure 15J:
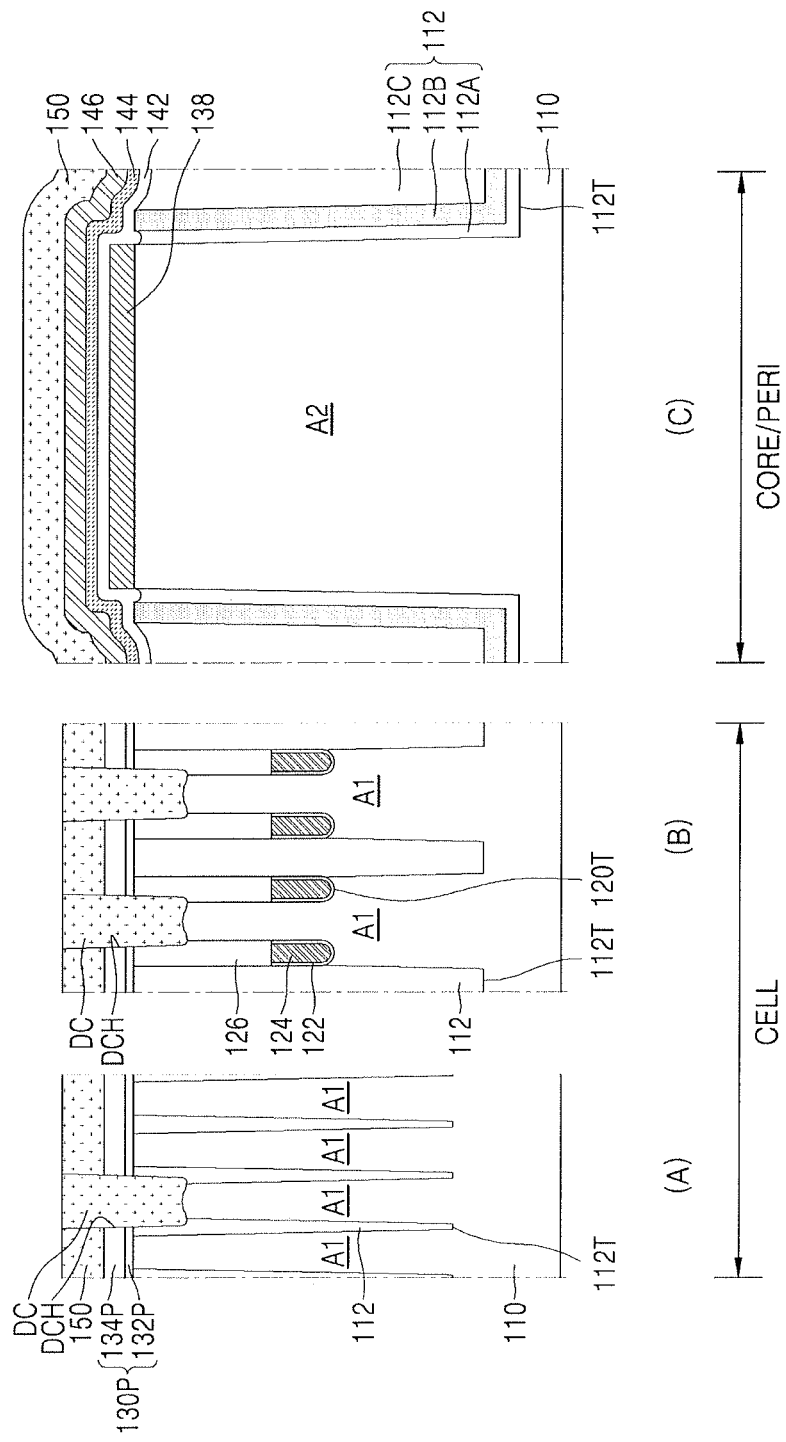
Figure 15K:
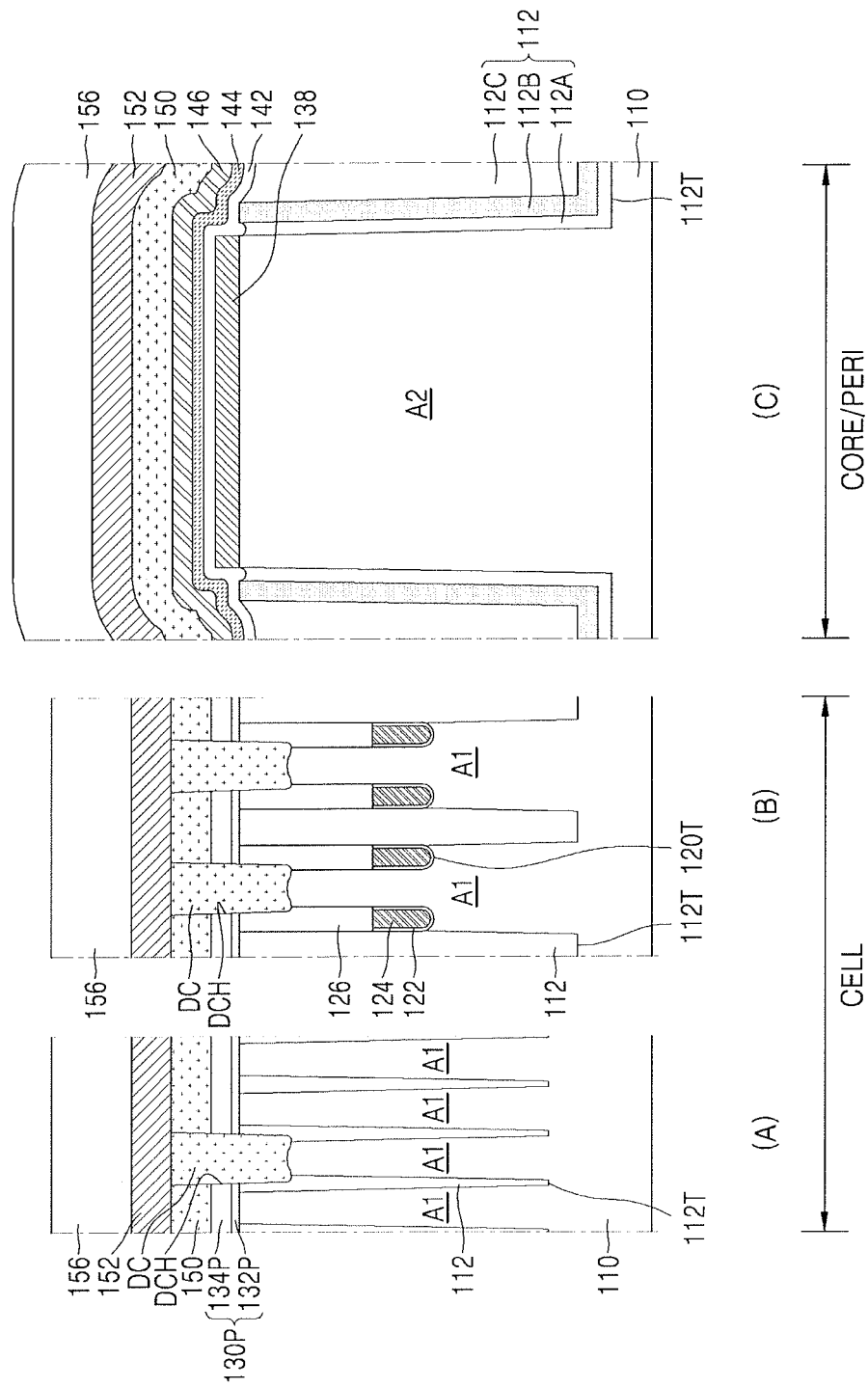
Figure 15L:
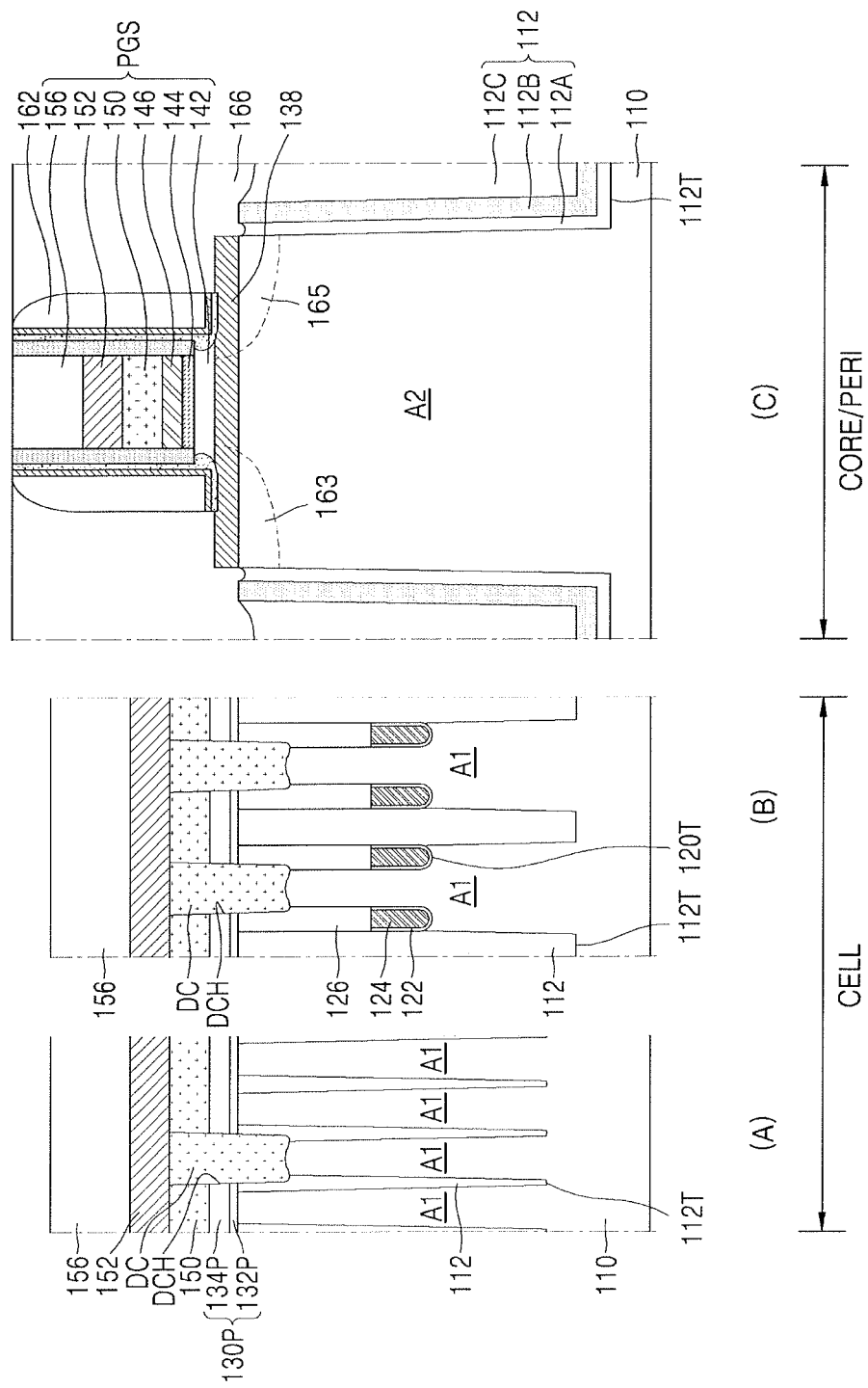
Figure 15M:
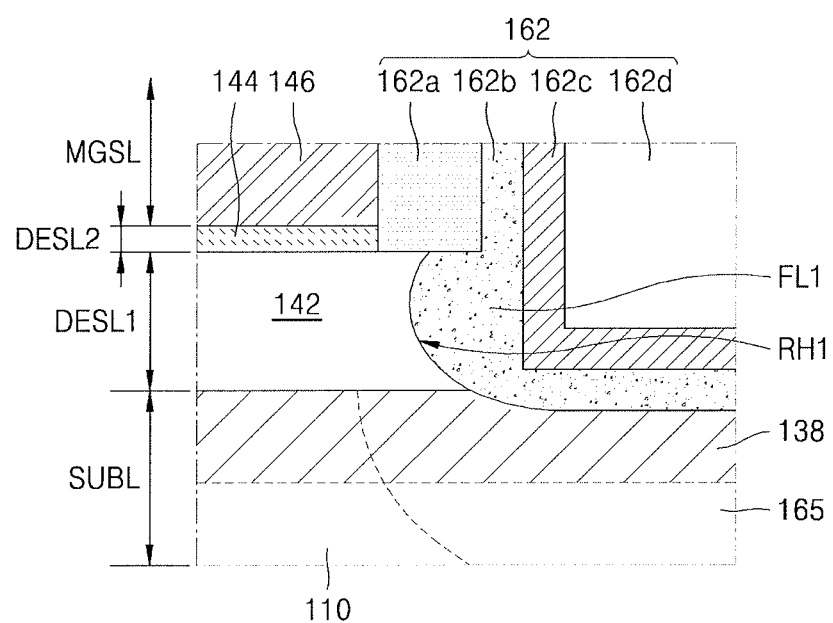
Figure 15N:
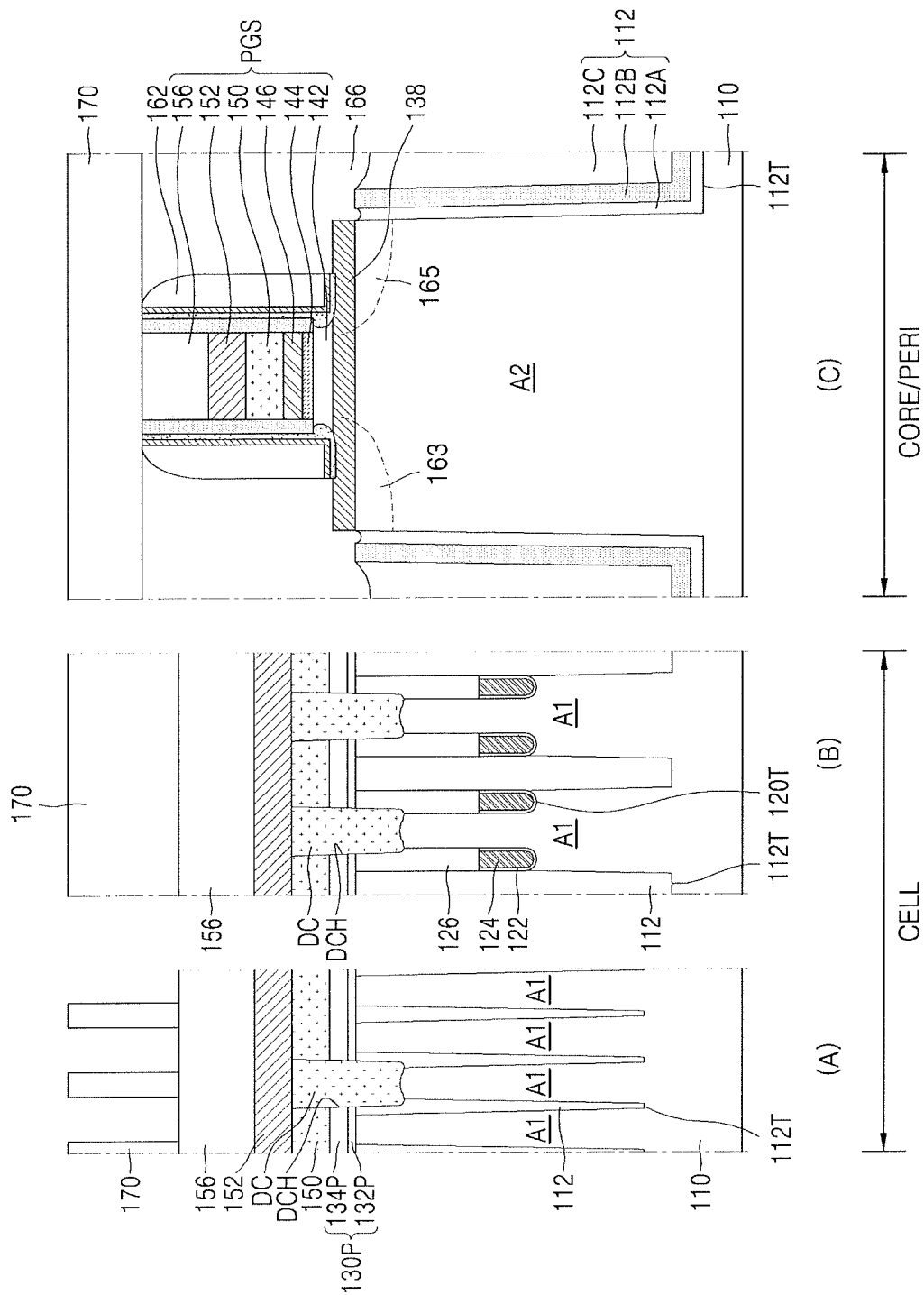
Figure 15O:
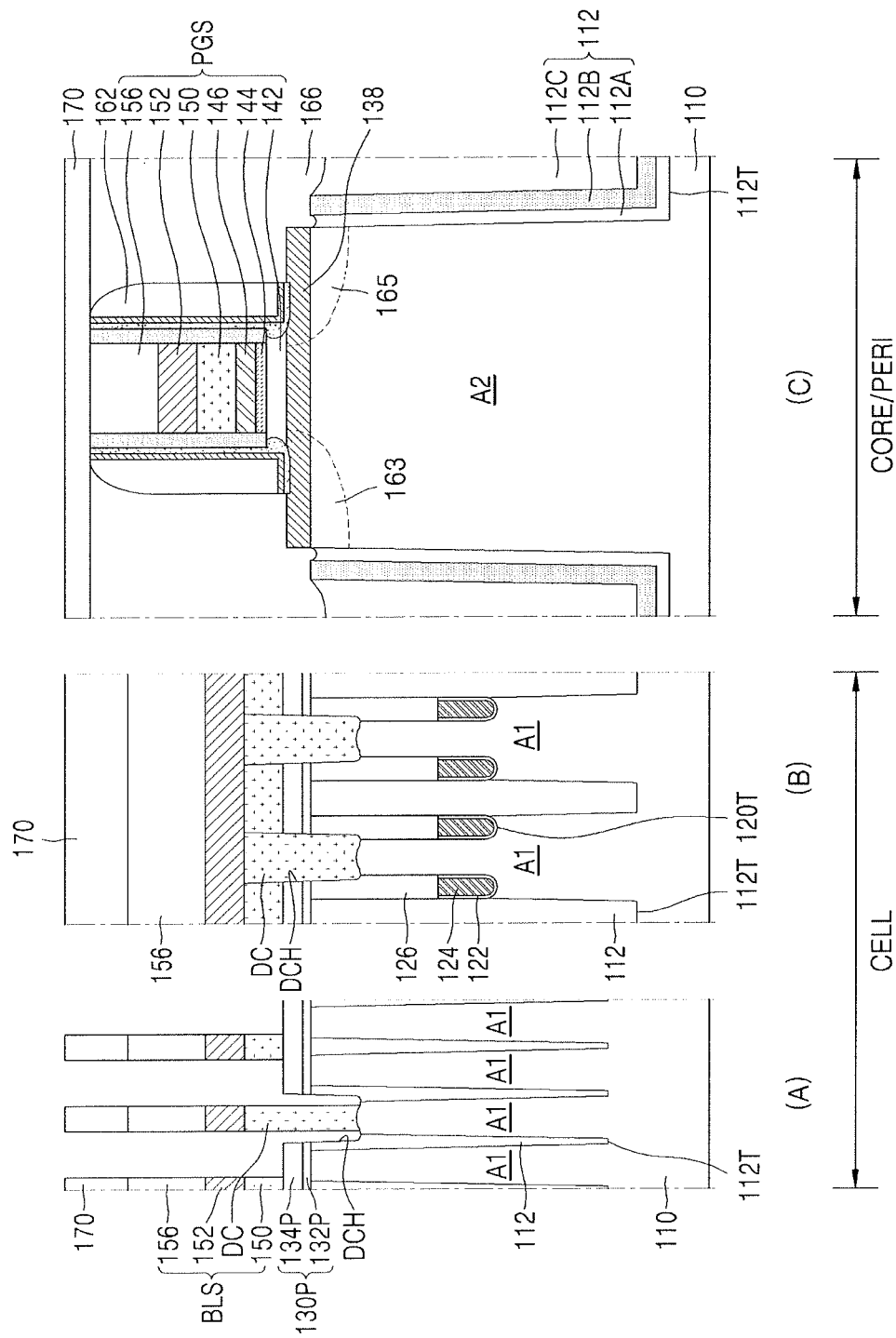
Figure 15P:
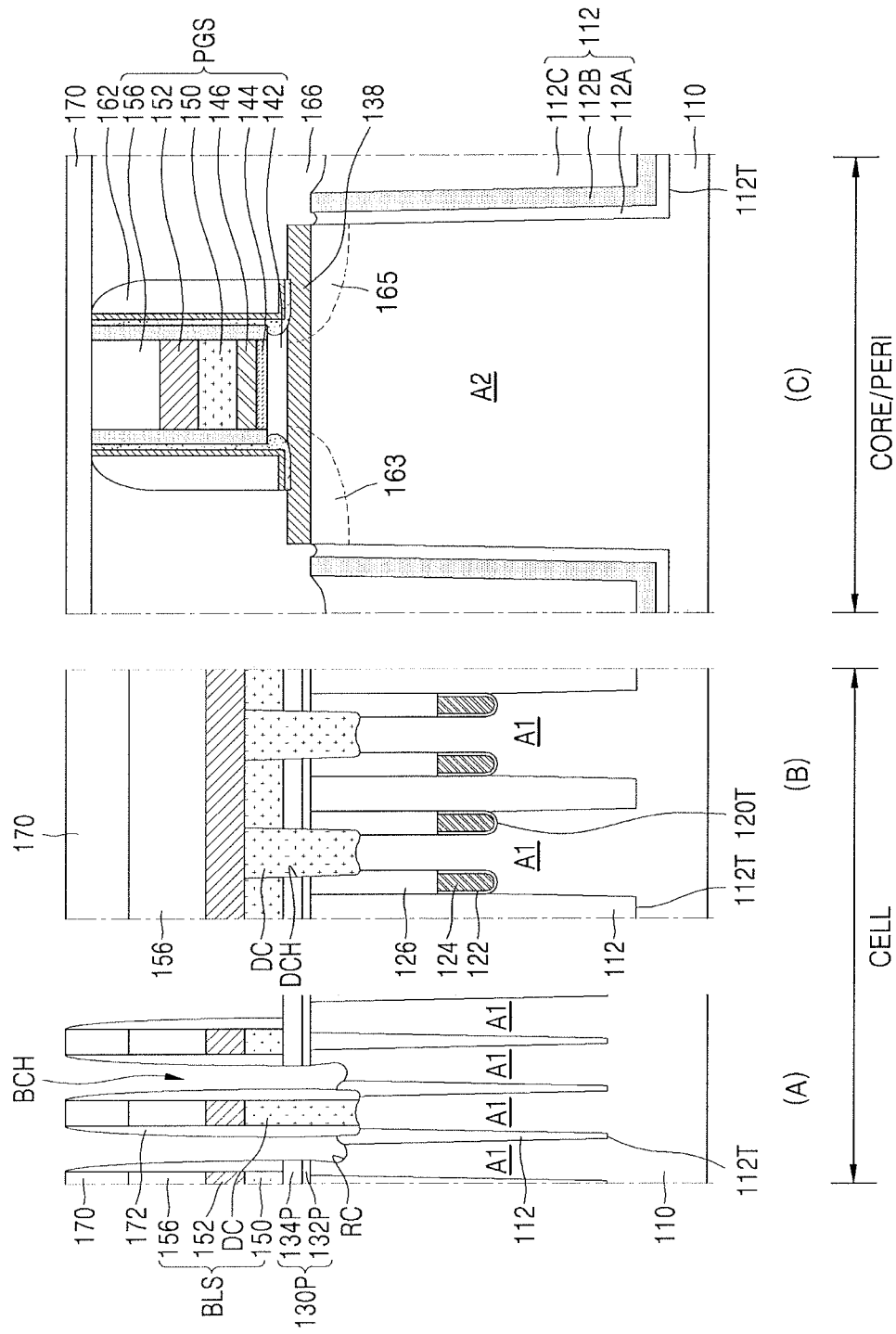
Figure 15Q:
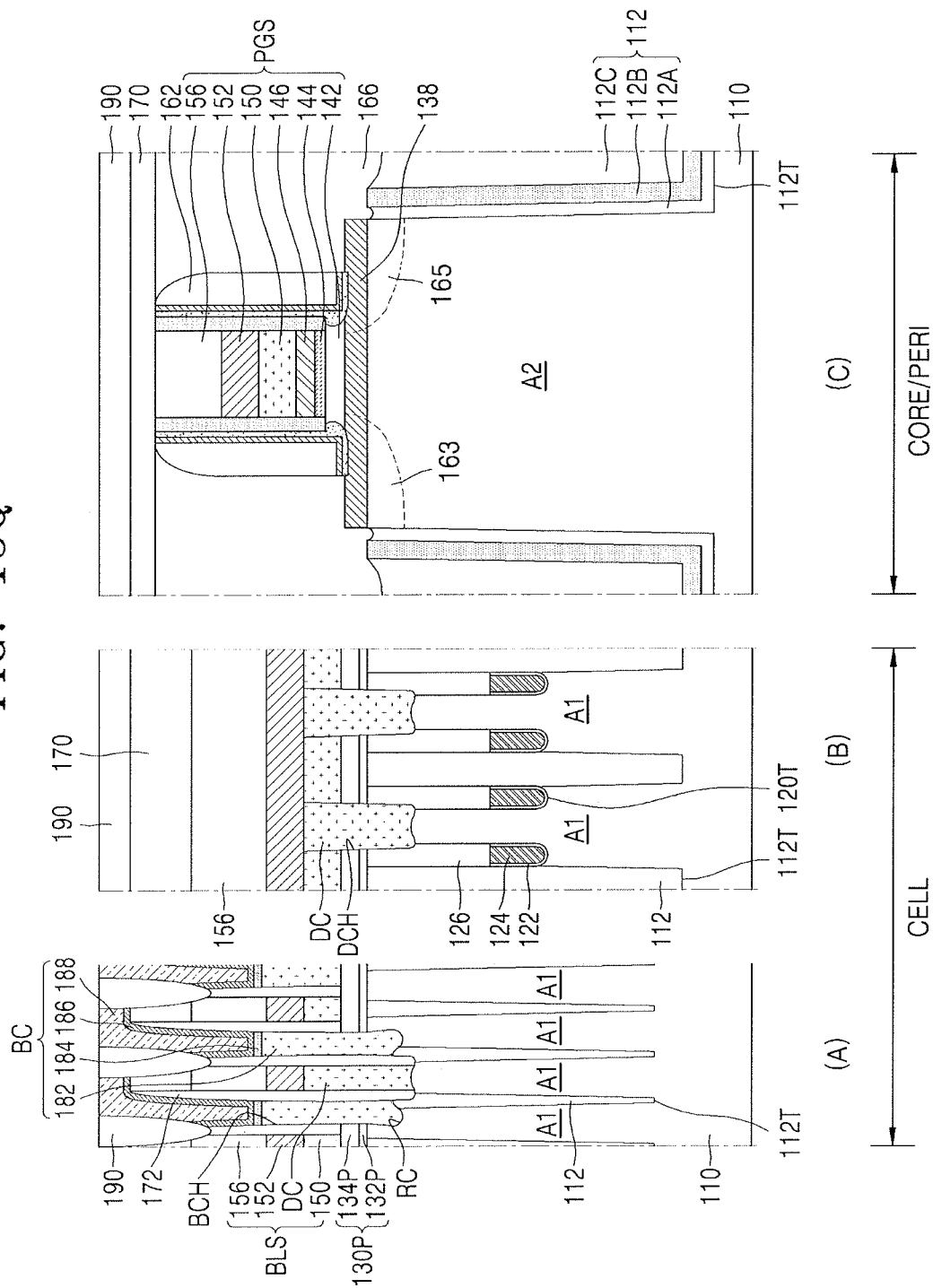

FIGS. 15A to 15Q are cross-sectional views that are sequentially provided to explain a method of manufacturing the memory device 50, according to an embodiment. In particular, referring to FIGS. 15A to 15Q, an exemplary method of manufacturing the memory device 50 having the components, which are described with reference to FIGS. 11 to 14, i.e., an integrated circuit device including the DRAM device, will be described.

FIGS. 15A to 15Q show cross-sections of a cell array area CELL and a peripheral circuit area CORE/PERI. The cell array area CELL may be part of the first area 52 described with reference to FIGS. 11 to 14. The peripheral circuit area CORE/PERI may be part of the second area 54 described with reference to FIGS. 11 to 14. The peripheral circuit area CORE/PERI may be part of the integrated circuit device 1 described with reference to FIGS. 1 to 3.

Referring to FIGS. 15A to 15Q, a cross-section marked as (A) may correspond to a portion taken along a line A-A' of FIG. 14, and a cross-section marked as (B) may correspond to a portion taken along a line B-B' of FIG. 14. A cross-section marked as (C) may be a peripheral circuit area of a memory device.

Referring to FIG. 15A, a semiconductor substrate 110 having the cell array area CELL and the peripheral circuit area CORE/PERI is prepared. The semiconductor substrate 110 may be the same as the substrate 12 of FIGS. 1 to 3. After device isolation trenches 112T are formed on the semiconductor substrate 110, device isolation layers 112 that fill the device isolation trenches 112T are formed. The cell active regions A1 are defined by the device isolation layers 112 in the cell array area CELL of the semiconductor substrate 110, and peripheral circuit active region A2 may be defined in the peripheral circuit area CORE/PERI.

As shown in FIG. 14, the cell active regions A1 may each have a planar shape of a relatively long island type which has a short axis and a long axis. The device isolation layer 112 may include, e.g., a silicon oxide film, a silicon nitride film, or a combination thereof. However, the device isolation layer 112 is not limited thereto. The device isolation layer 112 may be a single layer that is an insulating layer of one type, double layers that are insulating layers of two different types, or multiple layers that are a combination of insulating layers of at least three types.

In the peripheral circuit area CORE/PERI, the device isolation layer 112 may include a first insulating liner 112A, a second insulating liner 112B, and a buried insulating layer 112C which fills the device isolation trench 112T on the second insulating liner 112B, all of which are sequentially formed on an inner wall of the device isolation trench 112T. In some embodiments, the first insulating liner 112A may include an oxide film, the second insulating liner 112B may include a nitride film, and the buried insulating layer 112C may include an oxide film.

In some embodiments, the oxide film forming the first insulating liner 112A may be, e.g., a medium temperature oxidation (MTO) film, a high density plasma (HDP) oxide film, a thermal oxide film, a tetraethylorthosilicate (TEOS) film, or an undoped silicate glass (USG) film. The second insulating liner 112B may be, e.g., a silicon nitride film.

In some embodiments, the oxide film forming the buried insulating layer 112C may be, e.g., a tonen silazene (TOSZ) film, a HDP oxide film, or an USG oxide film. In other embodiments, the oxide film forming the buried insulating layer 112C may be, e.g., a spin-on-glass (SOG) oxide film including silicate, siloxane, methyl silsesquioxane (MSQ), hydrogen silsesquioxane (HSQ), polysilazane, or a combination thereof.

In the cell array area CELL, word line trenches 120T extending in parallel with one another may be formed on the semiconductor substrate 110. After outputs in which the word line trenches 120T are formed are rinsed, a gate dielectric layer 122 (or a gate insulating layer), a word line 124, and a buried insulating layer 126 may be sequentially formed in each word line trench 120T. The word lines 124 may from the word lines WL of FIG. 14.

By injecting impurity ions into both portions of the word lines 124 among the cell active regions A1, source areas and drain areas may be formed on upper surfaces of the cell active regions A1. In some embodiments, the source/drain areas may be formed before the word lines 124 are formed.

The gate dielectric layers 122 may be, e.g., a silicon oxide film, a silicon nitride film, a silicon oxynitride film, an oxide/nitride/oxide (ONO) film, or a high-k dielectric film having greater relative permittivity (dielectric constant) than a silicon oxide film. For example, the gate dielectric layers 122 may have dielectric constant ranging from about 10 to about 25.

In some embodiments, the gate dielectric layers 122 may include, e.g., $HfO_2$, $Al_2O_3$, $HfAlO_3$, $Ta_2O_3$, or $TiO_2$. The word lines 124 may include, e.g., Ti, TiN, Ta, TaN, W, WN, TiSiN, WSiN, or a combination thereof. The buried insulating layers 126 may include, e.g., a silicon oxide film, a silicon nitride film, a silicon oxynitride film, or a combination thereof.

Referring to FIG. 15B, an insulating layer 130 is formed above the semiconductor substrate 110 in the cell array area CELL and the peripheral circuit area CORE/PERI. The insulating layer 130 may include a first insulating layer 132 and a second insulating layer 134 that are sequentially formed above the semiconductor substrate 110. The first insulating layer 132 and the second insulating layer 134 may include different types of insulating materials. For example, the first insulating layer 132 may include an oxide film, and the second insulating layer 134 may include a nitride film. However, the first insulating layer 132 and the second insulating layer 134 are not limited thereto.

Referring to FIG. 15C, an insulating pattern 130P is formed by removing part of the insulating layer 130. By removing part of the first insulating layer 132 and the second insulating layer 134 to form the insulating pattern 130P, a first insulating pattern 132P and a second insulating pattern 134P may be formed.

In order to form the first insulating pattern 132P and the second insulating pattern 134P, portions of the first insulating layer 132 and the second insulating layer 134, which cover the peripheral circuit area CORE/PERI, may be removed. As a result, portions of the first insulating layer 132 and the second insulating layer 134 that cover the peripheral circuit area CORE/PERI may only remain.

In some embodiments, dry etching, wet etching, or a combination thereof may be used to remove portions of the first insulating layer 132 and the second insulating layer 134. In an embodiment, after the insulating layer 130 is covered with a mask pattern, the second insulating layer 134 and the first insulating layer 132 may be sequentially dry-etched by using the mask pattern as an etching mask, and then the second insulating pattern 134P and the first insulating pattern 132P may be formed. After the first insulating pattern 132P and the second insulating pattern 134P are formed, an upper surface of the peripheral circuit active region A2 may be exposed in the peripheral circuit area CORE/PERI.

Referring to FIG. 15D, an exposed surface of the peripheral circuit active region A2 is rinsed in the peripheral circuit area CORE/PERI, an undesired natural oxide layer in the peripheral circuit area CORE/PERI is removed. In some embodiments, plasma dry rinsing process may be performed to rinse the exposed surface of the peripheral circuit active region A2. During the plasma dry rinsing process, a hydrogen gas may be used as a rinsing gas. The hydrogen gas may be used to reduce and remove the undesired natural oxide layer in the peripheral circuit area CORE/PERI.

For example, after plasma is generated by injecting a process gas including $H_2$ and $SiH_2$ into the plasma generating device, a surface of the peripheral circuit active area A2 may be rinsed by using radicals activated by the generated plasma. In other embodiments, a wet rinsing process may be used to rinse the exposed surface of the peripheral circuit active area A2. The wet rinsing process may be performed using an HF solution.

During a rinsing process for removing the undesired natural oxide layer from the exposed surface of the peripheral circuit active area A2, portions of the device isolation layer 112 in the peripheral circuit area CORE/PERI which include oxide are partially consumed in a rinsing atmosphere, and thus recesses may be formed in upper portions of the first insulating liner 112A and the buried insulating layer 112C, respectively.

Referring to FIG. 15E, a buried mask layer 136 is formed above the semiconductor substrate 110. The buried mask layer 136 may prevent epitaxial growth in undesired portions on the semiconductor substrate 110. The buried mask layer 136 has a hole 136H exposing portions of the peripheral circuit active area A2 of the peripheral circuit area CORE/PERI which require epitaxial growth of the semiconductor layer.

FIG. 15E shows one hole 136H, but there may be multiple holes 136H exposing different portions of the peripheral circuit active area A2.

The buried mask layer 136 may be an insulating film that does not include metal. For example, the buried mask layer 136 may include silicon oxide, silicon nitride, silicon oxynitride (SiON), silicon oxycarbonitride (SiOCN), polysilicon, or a combination thereof. However, one or more embodiments are not limited thereto.

A chemical vapor deposition (CVD) process or an atomic layer deposition (ALD) process may be performed to form the buried mask layer 136. However, one or more embodiments are not limited thereto.

Referring to FIG. 15F, by using the buried mask layer 136 as an epitaxial growth prevention mask, a semiconductor material is grown by a selective epitaxial growth process from a surface of the peripheral circuit active area A2 that is exposed through the hole 136H of the buried mask layer 136, thereby forming a semiconductor layer 138.

The semiconductor layer 138 may include SiGe. In some embodiments, the semiconductor layer 138 may have a thickness ranging from about 20 Å to about 200 Å. When the semiconductor layer 138 is SiGe, Ge content in the semiconductor layer 138 may range from about 10 atom % to about 50 atom %.

Referring to FIGS. 15G and 15H, the buried mask layer 136 of the peripheral circuit area CORE/PERI is isotropic-etched and removed, as shown in FIG. 15G. The removal of the buried mask layer 136 may be omitted, e.g., not performed according to necessity. As shown in FIG. 15H, a first dielectric layer 142, a second dielectric layer 144, and a work function control layer 146 are sequentially formed in the cell array area CELL and the peripheral circuit area CORE/PERI.

The first dielectric layer 142 may include a silicon oxide layer. The first dielectric layer 142 may have a thickness less than that of the semiconductor layer 138 formed in the peripheral circuit area CORE/PERI. The first dielectric layer 142 may be formed by performing a CVD or ALD process.

The second dielectric layer 144 may include a high-k dielectric layer having greater dielectric constant than a silicon oxide layer. The second dielectric layer 144 may have greater dielectric constant than the first dielectric layer 142. The second dielectric layer 144 may include a metal-containing layer having dielectric constant ranging from about 10 to about 25. For example, the second dielectric layer 144 may include $HfO_2$, $Al_2O_3$, $HfAlO_3$, $Ta_2O_3$, or $TiO_2$. The second dielectric layer 144 may have a thickness less than that of the first dielectric layer 142.

The work function control layer 146 may include, e.g., metal, conductive metal nitride, conductive metal carbide, a conductor including metal atoms, or a combination thereof. The work function control layer 146 may have a single layer or multilayer structure. The work function control layer 146 may include at least one of, e.g., Ti, Ta, Al, Ni, Co, La, Nb, Mo, Hf, Ir, Ru. Pt, Yb. Dy, Er, Pd, TiAl, HfSiMo, TiN, WN, TaN, RuN, MoN, TiAlN, TaC, TiC, and TaC. In some embodiments, the work function control layer 146 may have at least one stack structure of, e.g., TiN/TaN, Al2O3/TiN, Al/TiN, TiN/Al/TiN, TiN/TiON, Ta/TiN, TaN/TiN, La/TiN, Mg/TiN, and Sr/TiN. Here, TiN may be replaced with, e.g., TaN, TaCN, TiCN, CoN, or CoCN, and La may be replaced with, e.g., LaO or LaON.

Referring to FIG. 15I, portions of the first dielectric layer 142, the second dielectric layer 144, and the work function control layer 146 are respectively removed to expose the second insulating pattern 134P.

To expose the second insulating pattern 134P in the cell array area CELL, an etching process may be performed to remove portions of the first dielectric layer 142, the second dielectric layer 144, and the work function control layer 146 which cover the cell array area CELL. As a result, remaining portions of the first dielectric layer 142, the second dielectric layer 144, and the work function control layer 146 may only cover the peripheral circuit area CORE/PERI.

Referring to FIG. 15J, after a first conductive layer 150 extending over the semiconductor substrate 110 is formed in the cell array area CELL and the peripheral circuit area CORE/PERI, direct contact holes DCH exposing the cell active regions A1 are formed by etching some portions of each of the first conductive layer 150, the second insulating pattern 134P, and the first insulating pattern 132P and some portions of the semiconductor substrate 110 and penetrating the first conductive layer 150, the second insulating pattern 134P, and the first insulating pattern 132P. The direct contacts DC that fill the direct contact holes DCH are formed.

The first conductive layer 150 may include doped polysilicon or metal, e.g., W, Mo, Au, Cu, Al, Ni, or Co. The first conductive layer 150 may be a single layer including a material selected from among the above-listed materials, or layers including at least two thereof.

The direct contact DC may include doped polysilicon or metal, e.g., W, Mo, Au, Cu, Al, Ni, or Co. In some embodiments, the direct contact DC may include the same material as the first conductive layer 150.

In some embodiments, a metal silicide layer may be further formed between the semiconductor substrate 110 and the direct contact DC. For example, the metal silicide layer may include, e.g., tungsten silicide, nickel silicide, or cobalt silicide. However, one or more embodiments are not limited thereto.

Referring to FIG. 15K, a second conductive layer 152 and a capping layer 156 extending on the first conductive layer 150 are sequentially formed in the cell array area CELL and the peripheral circuit area CORE/PERI. The second conductive layer 152 may include, e.g., TiSiN, TiN, TaN, CoN, metal, metal silicide, or a combination thereof. The metal or metal silicide may include, e.g., W, Mo, Au, Cu, Al, Ni, or Co. The capping layer 156 may include a silicon nitride layer.

Referring to FIGS. 15L and 15M, while the cell array area CELL is protected by a mask pattern, a peripheral circuit gate stack structure PGS is formed in the peripheral circuit area CORE/PERI by etching, in the peripheral circuit area CORE/PERI, a peripheral circuit stack structure including the first dielectric layer 142, the second dielectric layer 144, the work function control layer 146, the first conductive layer 150, the second conductive layer 152, and the capping layer 156.

The peripheral circuit gate stack structure PGS may correspond to the gate stack structure GS of FIG. 2. In the peripheral circuit gate stack structure PGS, the first dielectric layer 142 may correspond to the first dielectric layer 19 of FIG. 2. The second dielectric layer 144 may correspond to the second dielectric layer 20 of FIG. 2. The work function control layer 146 may correspond to the work function control layer 25 of FIG. 2. The first conductive layer 150 may correspond to the first gate layer 26 of FIG. 2. The second conductive layer 152 may correspond to the second gate layer 33 of FIG. 2. The capping layer 156 may correspond to the capping layer 34 of FIG. 2.

After the recess hole RH1 is recessed into the first dielectric layer 142 under the peripheral circuit gate stack structure PGS, the buried dielectric layer FL1 is formed in the recess hole RH1. Then, spacer structures 162 are formed to cover both side walls of the peripheral circuit gate stack structure PGS and the buried dielectric layer FL1. The spacer structures 162 may correspond to the gate spacer structures SPG1 of FIG. 2.

The spacer structures 162 each include a first spacer 162a, a second spacer 162b, a third spacer 162c, and a fourth spacer 162d. The first spacer 162a, the second spacer 162b, the third spacer 162c, and the fourth spacer 162d may correspond to the first spacer 36, the second spacer 38, the third spacer 40, and the fourth spacer 42, respectively.

Since the method of manufacturing the spacer structures 162 are described above with reference to FIGS. 8A to 8D, the descriptions thereof will not be repeated. The buried dielectric layer FL1 and the spacer structures 162 may correspond to the buried dielectric layers FL2 and FL3 and the spacer structures SPG2 and SPG3 of FIGS. 4 to 7.

In the peripheral circuit area CORE/PERI, a source area 163 and a drain area 165 are formed by injecting impurities into the semiconductor substrate 110 above which the peripheral circuit gate stack structure PGS and the spacer structures 162 are formed. In an embodiment, the source area 163 and the drain area 165 may be formed by injecting impurities into a semiconductor substrate after the formation of the peripheral circuit gate stack structure PGS and further injecting impurities after the formation of the spacer structures 162.

Then, an interlayer insulating layer 166 is formed to cover the peripheral circuit gate stack structure PGS and the spacer structures 162. The interlayer insulating layer 166 may include a HDP oxide layer or a silicon oxide layer formed by performing a flowable CVD (FCVD) method.

Referring to FIGS. 15N to 15O, a mask pattern 170 is formed above the semiconductor substrate 110 as shown in FIG. 15N. The peripheral circuit area CORE/PERI may be protected by the mask pattern 170, and an upper surface of the capping layer 156 may be partially exposed in the cell array area CELL. The mask pattern 170 may include a silicon nitride layer.

As shown in FIG. 15O, a cell stack structure including the direct contact DC, the first conductive layer 150, the second conductive layer 152, and the capping layer 156 is etched in the cell array area CELL by using the mask pattern 170 as an etching mask, and thus bit-line structures BLS extending in parallel with each other are formed in the cell array area CELL. The first conductive layer 150 and the second conductive layer 152 included in the bit-line structure BLS may form the bit line BL of FIG. 14.

Referring to FIG. 15P, recesses RC exposing the cell active regions A1 are formed by forming insulating spacers 172, which cover both side walls of each bit-line structure BLS in the cell array area CELL, and etching part of the semiconductor substrate 110, which is exposed by the insulating spacers 172, and part of the device isolation layers 112. Between two adjacent bit-line structures BLS, the recesses RC are connected to the buried contact holes BCH of which widths are defined by a pair of insulating spacers 172.

Spacer insulating layers covering the bit-line structures BLS are formed to form the insulating spacers 172 and the recesses RC, and a process of etching back the spacer insulating layers and a process of etching part of each of the semiconductor substrate 110 and the device isolation layer 112 may be performed.

Referring to FIG. 15Q, buried conductive layers 182, metal silicide layers 184, conductive barrier layers 186, and conductive layers 188 are sequentially stacked in the buried contact holes BCH by respectively filling the recesses RC between the bit-line structures BLS. The buried conductive layers 182, the metal silicide layers 184, the conductive barrier layers 186, and the conductive layers 188 may form the buried contacts BC.

Also, portions of the conductive layers 188 that extend on upper surfaces of the bit-line structures BLS may be used as landing pads to which lower electrodes of capacitors formed in a subsequent process may be connected. The conductive layers 188 may correspond to the landing pads LP described with reference to FIG. 14.

The buried conductive layers 182 may be formed by performing CVD, PVD, or an epitaxial growth process. The buried conductive layers 182 may each include a semiconductor material doped with impurities, metal, conductive metal nitride, metal silicide, or a combination thereof.

The metal silicide layers 184 may each include cobalt silicide, nickel silicide, or manganese silicide. In some embodiments, the metal silicide layers 184 may not be formed. The conductive barrier layers 186 may have a stack structure including Ti/TiN.

The conductive layers 188 may each include doped polysilicon, metal, metal silicide, conductive metal nitride, or a combination thereof. For example, the conductive layers 188 may each include W. While the conductive barrier layers 186 and the conductive layers 188 are formed in the cell array area CELL, contact plugs (not shown) capable of being electrically connected to the peripheral circuit active areas A2 may be formed in the peripheral circuit area CORE/PERI.

The conductive layers 188 may be electrically insulated from each other by insulating layers 190 that fill space around the conductive layers 188. Then, in the cell array area CELL, the lower electrodes of the capacitors that may be electrically connected to the conductive layers 188 may be formed on the insulating layers 190.

By way of summation and review, embodiments provide an integrated circuit device to improve the reliability of a gate insulating layer and decrease parasitic capacitance by optimizing components of gate spacer structures.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An integrated circuit device, comprising:
 a gate stack structure on a base layer, the gate stack structure including:
  a gate insulating layer, the gate insulating layer including a first dielectric layer on the base layer and having first relative permittivity, and a gate structure on the gate insulating layer; and
a gate spacer structure on opposite side walls of the gate stack structure and on the base layer, the gate spacer structure including a buried dielectric layer buried in a recess hole of the gate insulating layer at a lower portion of the gate spacer structure on the base layer, and the buried dielectric layer including a same material as the first dielectric layer,
wherein the gate insulating layer separates the buried dielectric layer in the recess hole from the gate structure.

2. The integrated circuit device as claimed in claim 1, wherein:
the base layer includes at least one of a semiconductor substrate and a semiconductor layer, and a memory cell area and a peripheral circuit area on the at least one of the semiconductor substrate and the semiconductor layer, and
the gate insulating layer, the gate structure, and the gate spacer structure are in the peripheral circuit area.

3. The integrated circuit device as claimed in claim 1, wherein the gate insulating layer further includes a second dielectric layer on the first dielectric layer, the second dielectric layer having second relative permittivity greater than the first relative permittivity.

4. The integrated circuit device as claimed in claim 3, wherein the first dielectric layer has a greater thickness than the second dielectric layer.

5. The integrated circuit device as claimed in claim 1, wherein each of the first dielectric layer and the buried dielectric layer includes a silicon oxide layer.

6. The integrated circuit device as claimed in claim 1, wherein the gate structure has a metal gate structure including a metal layer.

7. The integrated circuit device as claimed in claim 1, wherein the gate structure includes a work function control layer, a first gate layer, and a second gate layer sequentially positioned on the gate insulating layer.

8. The integrated circuit device as claimed in claim 1, wherein the gate spacer structure includes:
a first spacer on opposite side walls of the gate structure, the first spacers including a third dielectric layer having third relative permittivity greater than the first relative permittivity, and having a linear bar shape;
a second spacer on a side wall of the first spacer, on a side wall of the buried dielectric layer, and on the base layer, the second spacer being integral with the buried dielectric layer in an L-shape, and including a same material as the buried dielectric layer;
a third spacer on a side wall and on an upper portion of the second spacer, the third spacer including a same material as the first spacer, and having an L-shape; and
a fourth spacer on a side wall and on an upper portion of the third spacer, the fourth spacer including a same material as the second spacer.

9. The integrated circuit device as claimed in claim 8, wherein each of the first spacer and the third spacer includes a silicon nitride layer, and each of the buried dielectric layer, the second spacer, and the fourth spacer includes a silicon oxide layer.

10. The integrated circuit device as claimed in claim 1, wherein the gate spacer structure includes:
a first spacer on both opposite walls of the gate structure, including a third dielectric layer having third relative permittivity greater than the first relative permittivity, and having a linear bar shape;
a second spacer on a side wall of the first spacer and on a side wall of the buried dielectric layer, integral with the buried dielectric layer in a linear bar shape, and including a same material as the buried dielectric layer;
a third spacer on a side wall of the second spacer and on the base layer, including a same material as the first spacer, and having an L-shape; and
a fourth spacer on a side wall and on an upper portion of the third spacer, and including a same material as the second spacer.

11. The integrated circuit device as claimed in claim 10, wherein each of the first spacer and the third spacer includes a silicon nitride layer, and each of the buried dielectric layer, the second spacer, and the fourth spacer includes a silicon oxide layer.

12. The integrated circuit device as claimed in claim 1, wherein the gate spacer structure includes:
a first spacer on opposite side walls of the gate structure, including a third dielectric layer having third relative permittivity greater than the first relative permittivity, and having a linear bar shape;
a second spacer on a side wall of the first spacer, on a side wall of the buried dielectric layer, and on the base layer, including a same material as the first spacer, and having an L-shape; and
a third spacer on a side wall and on an upper portion of the second spacer, and including a same material as the buried dielectric layer.

13. The integrated circuit device as claimed in claim 12, wherein each of the first spacer and the second spacer includes a silicon nitride layer, and each of the buried dielectric layer and the third spacer includes a silicon oxide layer.

14. An integrated circuit device, comprising:
a gate stack structure including:
a gate insulating layer, the gate insulating layer having a first dielectric layer on a base layer and having first relative permittivity, and a second dielectric layer having second relative permittivity greater than the first relative permittivity, and
a gate structure on the gate insulating layer, the gate structure including a metal layer; and
a gate spacer structure on opposite side walls of the gate stack structure and on the base layer, the gate spacer structure including:
a first spacer on opposite side walls of the gate structure, including a third dielectric layer having third relative permittivity greater than the first relative permittivity, and having a linear bar shape,
a second spacer including a buried dielectric layer buried in a recess hole in the first dielectric layer, the second spacer including a same material as the first dielectric layer at a lower portion of the first spacer, on a side wall of the first spacer and a side wall of the buried dielectric layer, integrally disposed with the buried dielectric layer, and including a same material as the buried dielectric layer,
a third spacer on a side wall of the second spacer, including a same material as the first spacer, and having an L shape, and
a fourth spacer on a side wall and an upper portion of the third spacer and including a same material as the second spacer,
wherein a bottom of the first spacer overlaps the gate insulating layer and the buried dielectric layer in the recess hole, such that the gate insulating layer separates the buried dielectric layer in the recess hole from the gate structure.

15. The integrated circuit device as claimed in claim 14, wherein the second spacer is connected to the buried dielectric layer and is on the base layer so that the second spacer has an L shape, and the third spacer is on the second spacer on the base layer.

16. The integrated circuit device as claimed in claim 14, wherein the second spacer is on a side wall of the first spacer and on a side wall of the buried dielectric layer in a linear bar shape, and the third spacer is on a side wall of the second spacer and on the base layer.

17. The integrated circuit device as claimed in claim 14, wherein each of the first spacer and the third spacer includes a silicon nitride layer, and each of the first dielectric layer, the buried dielectric layer, the second spacer, and the fourth spacer includes a silicon oxide layer.

18. The integrated circuit device as claimed in claim 14, further comprising source and drain areas under opposite side walls of the gate stack structure, respectively, the source and drain areas being completely separated from each other, and the gate spacer structure on the opposite side walls of the gate stack structure overlapping tops of the source and drain areas, respectively.

19. An integrated circuit device, comprising:
a gate stack structure including a gate insulating layer and a gate structure on the gate insulating layer, the gate insulating layer including a first dielectric layer on a base layer and having first relative permittivity and a second dielectric layer having second relative permittivity greater than the first relative permittivity, and the gate structure including a metal layer; and
a gate spacer structure on opposite side walls of the gate stack structure on the base layer, the gate spacer structure including:
a first spacer on opposite side walls of the gate structure, including a third dielectric layer having third relative permittivity greater than the first relative permittivity, and having a linear bar shape,
a buried dielectric layer buried in a recess hole in the first dielectric layer and having a same material as the first dielectric layer at a lower portion of the first spacer,
a second spacer on a side wall of the first spacer and a side wall of the buried dielectric layer and the base layer, and including a same material as the first spacer, and
a third spacer on a side wall and an upper portion of the second spacer, and including a same material as the buried dielectric layer,
wherein the gate insulating layer separates the buried dielectric layer in the recess hole from the gate structure.

20. The integrated circuit device as claimed in claim 19, wherein:
each of the first spacer and the second spacer includes a silicon nitride layer,
each of the first dielectric layer, the buried dielectric layer, and the third spacer includes a silicon oxide layer, and
a width of the third spacer is greater than widths of the first spacer and the second spacer.

* * * * *